US012784837B2

(12) United States Patent
Choi

(10) Patent No.: US 12,784,837 B2
(45) Date of Patent: Nov. 3, 2026

(54) MEMORY DEVICE AND OPERATING METHOD THEREOF

(71) Applicant: Samsung Electronics Co., Ltd., Suwon-si (KR)

(72) Inventor: Yonghyuk Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 103 days.

(21) Appl. No.: 19/012,078

(22) Filed: Jan. 7, 2025

(65) Prior Publication Data

US 2025/0273271 A1 Aug. 28, 2025

(30) Foreign Application Priority Data

Feb. 28, 2024 (KR) ........................ 10-2024-0029234

(51) Int. Cl.

| | |
|---|---|
| ***G11C 16/10*** | (2006.01) |
| ***G11C 16/14*** | (2006.01) |
| ***G11C 16/28*** | (2006.01) |
| ***G11C 16/34*** | (2006.01) |

(52) U.S. Cl.

CPC ............ *G11C 16/102* (2013.01); *G11C 16/14* (2013.01); *G11C 16/28* (2013.01); *G11C 16/3495* (2013.01)

(58) Field of Classification Search

CPC ....... G11C 16/102; G11C 16/14; G11C 16/28; G11C 16/3495

USPC .................................................. 365/189.011

See application file for complete search history.

(56) References Cited

U.S. PATENT DOCUMENTS

| | | | |
|---|---|---|---|
| 8,446,776 | B2 | 5/2013 | Hwang et al. |
| 9,036,419 | B2 | 5/2015 | Park et al. |
| 9,589,640 | B2 | 3/2017 | Moon et al. |
| 9,685,235 | B2 | 6/2017 | Park et al. |
| 9,747,997 | B2 | 8/2017 | Lee et al. |
| 9,842,658 | B2 | 12/2017 | Lee |
| 10,825,530 | B2 | 11/2020 | Song et al. |
| 10,971,238 | B2 | 4/2021 | Kanamori et al. |
| 2013/0322174 | A1 | 12/2013 | Li et al. |
| 2014/0247665 | A1 | 9/2014 | Avila et al. |
| 2016/0307633 | A1 | 10/2016 | Lee |

(Continued)

FOREIGN PATENT DOCUMENTS

| | | | |
|---|---|---|---|
| KR | 102545044 | B1 | 6/2023 |
| KR | 20240087396 | A | 6/2024 |

*Primary Examiner* — Connie C Yoha

(74) *Attorney, Agent, or Firm* — Wolf, Greenfield & Sacks, P.C.

(57) ABSTRACT

A memory device includes a plurality of cell blocks, each of the cell blocks including a memory cell array including a plurality of cell strings, connected in parallel between a bit line and a common source line, and a control logic. At least one of the plurality of cell blocks includes a plurality of ground selection transistors connected to a corresponding plurality of special word lines. The control logic performs an erase operation on a first subset of the plurality of ground selection transistors at every N number of erase/program (E/P) cycles from a first time point and then programs the first subset of the plurality of ground selection transistors to a first threshold voltage, and may perform an erase operation on a second subset of the plurality of ground selection transistors and then program the second subset of the plurality of ground selection transistors to a second threshold voltage.

20 Claims, 25 Drawing Sheets

(56) References Cited

U.S. PATENT DOCUMENTS

| | | | | |
|---|---|---|---|---|
| 2018/0047449 | A1 | 2/2018 | Nam et al. | |
| 2023/0128177 | A1 | 4/2023 | Oowada et al. | |
| 2023/0134907 | A1 | 5/2023 | Lee et al. | |
| 2024/0194268 | A1* | 6/2024 | Choi .................. | G11C 16/0483 |

* cited by examiner

MEMORY DEVICE AND OPERATING METHOD THEREOF

CROSS-REFERENCE TO RELATED APPLICATION

This application is based on and claims priority under 35 U.S.C. § 119 to Korean Patent Application No. 10-2024-0029234, filed on Feb. 28, 2024, in the Korean Intellectual Property Office, the disclosure of which is incorporated by reference herein in its entirety.

BACKGROUND

The inventive concept relates to a memory device and an operating method thereof.

Non-volatile memory devices are a type of memory device and include a plurality of memory cells which non-volatilely store data. As an example of non-volatile memory devices, flash memory devices may be used in portable phones, digital cameras, portable digital assistants (PDA), mobile computer devices, stationary computer devices, and the other devices.

Three-dimensional (3D) memory devices including a plurality of vertical channel structures extending in a vertical direction on a substrate have been developed for increasing the capacity of memory devices. Also, a method for increasing the number of word lines stacked in a vertical direction on a substrate or removing a dummy hole formed in a memory device has been proposed for enhancing the degree of integration of memory devices.

However, an increase in the degree of integration of memory devices causes an increase in interference between word lines, string selection lines, and ground selection lines, and due to this, the reliability of data may be reduced. Particularly, transistors associated with setting and operating under an operation environment of memory devices need to maintain reliability thereof despite enhancement in the degree of integration.

SUMMARY

The inventive concept provides a memory device and an operating method thereof, wherein the memory device may have an increased degree of integration and reliability.

A memory device according to an embodiment may include a plurality of cell blocks, and each of the cell blocks may include a memory cell array which includes a plurality of cell strings connected in parallel between a bit line and a common source line and a control logic which controls a program operation, a read operation, and an erase operation on the memory cell array. At least one of the plurality of cell blocks may include a plurality of ground selection transistors connected to a plurality of special word lines. Some of the plurality of ground selection transistors may be programmed to be a first threshold voltage, and the other ground selection transistors may be programmed to be a second threshold voltage which is higher than the first threshold voltage. The control logic may control an erase operation on some of the plurality of ground selection transistors at every N (where N may be an integer of 1 or more) number of erase/program (E/P) cycles from a first time point and then program with the first threshold voltage, and may control an erase operation on the other ground selection transistors and then program with the second threshold voltage.

An operating method of a memory device including a plurality of cell blocks according to an embodiment may include an operation of performing an erase operation on some of a plurality of ground selection transistors at every N (where N may be an integer of 1 or more) number of erase/program (E/P) cycles from a first time point and then programming with the first threshold voltage, and an operation of performing an erase operation on the other ground selection transistors and then programming with the second threshold voltage. At least one of the plurality of cell blocks may include a plurality of ground selection transistors connected to a plurality of special word lines.

A memory device according to an embodiment may include a plurality of cell blocks, and each of the plurality of cell blocks may include a memory cell array which includes a plurality of cell strings connected in parallel between a bit line and a common source line and a control logic which controls a program operation, a read operation, and an erase operation on the memory cell array. At least one of the plurality of cell blocks may include a special word line region which includes a plurality of ground selection transistors connected to a plurality of special word lines and a plurality of dummy transistors connected to a plurality of special dummy lines. Some of the plurality of ground selection transistors may be programmed with a first threshold voltage, and the other ground selection transistors may be programmed with a second threshold voltage which is higher than the first threshold voltage. The control logic may control an erase operation on some of the plurality of ground selection transistors at every N (where N may be an integer of 1 or more) number of erase/program (E/P) cycles from a first time point and then program with the first threshold voltage, and may control an erase operation on the other ground selection transistors and then program with the second threshold voltage. The control logic may perform control so that the number of dummy transistors decreases from the first time point.

BRIEF DESCRIPTION OF THE DRAWINGS

Embodiments will be more clearly understood from the following detailed description taken in conjunction with the accompanying drawings, wherein like reference numerals (when used) indicate corresponding elements throughout the several views, and in which.

DETAILED DESCRIPTION

Hereinafter, embodiments will be described in detail with reference to the accompanying drawings.

Figure 1:
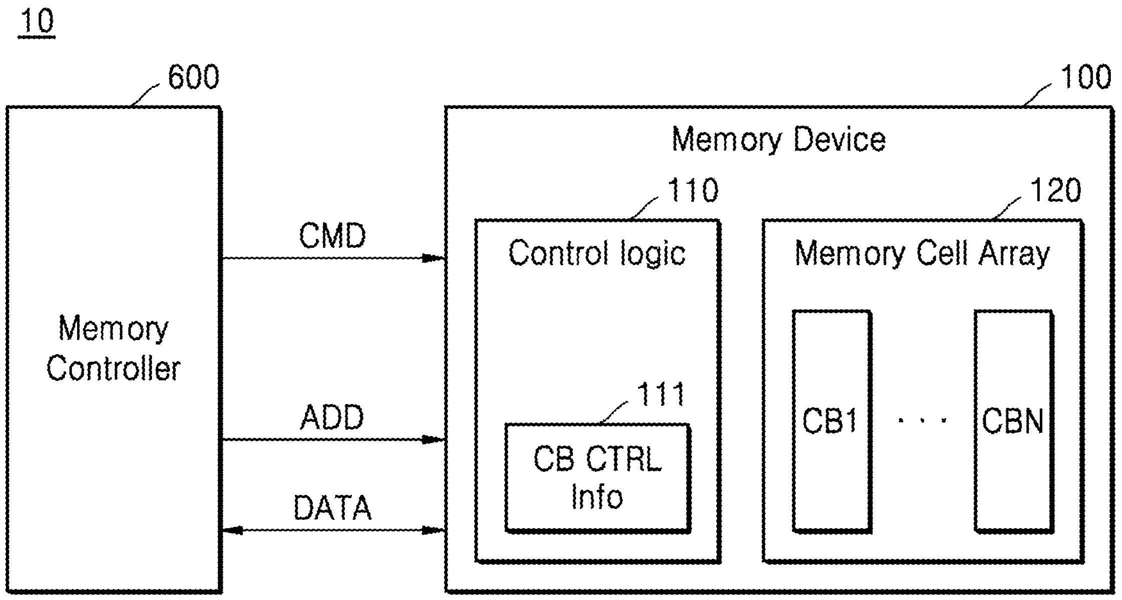
FIG. 1 illustrates a block diagram of an example memory system according to an embodiment.

FIG. 1 illustrates a block diagram of a memory system 10 according to an embodiment.

Referring to FIG. 1, the memory system 10 may include a memory controller 600 and a memory device 100, and the memory device 100 may include a memory cell array 120 and a control logic 110. Although not shown in FIG. 1, the memory device 100 may further include a voltage generator which generates various voltages associated with programming/reading/erasing of data and a page buffer and other various elements each connected to the memory cell array 120 through bit lines.

According to an embodiment, the memory device 100 may include a non-volatile memory device. For example, the memory device 100 may include a non-volatile memory device such as NAND flash memory, vertical NAND flash memory, NOR flash memory, resistive random-access memory (RAM), phase-change memory (PCM), or magnetoresistive RAM (MRAM). In some embodiments, the memory device 100 or the memory system 10 may be implemented as an embedded memory embedded in an electronic device, or may be implemented as an external memory attachable/detachable on/from an electronic device. For example, the memory device 100 or the memory system 10 may be implemented as various types such as universal flash storage (UFS) memory device, embedded multimedia card (eMMC), solid state drive (SSD), UFS memory card, compact flash (CF), secure digital (SD), micro secure digital (micro-SD), mini secure digital (mini-SD), extreme digital (xD), and memory stick.

The memory controller 600 may control the memory device 100 to read data stored in the memory device 100 or write (or program) data in the memory device 100, in response to a write/read request from a host HOST. In detail, the memory controller 600 may provide an address ADD and a command CMD to the memory device 100 and may thus control program, read, and erase operations on the memory device 100. Also, data DATA to be written in the memory device 100 and the data DATA read from the memory device 100 may be transferred and received between the memory controller 600 and the memory device 100.

The memory cell array 120 may include a plurality of cell blocks CB1 to CBN, where N is an integer greater than one. When the memory device 100 corresponds to a vertical NAND flash memory device, each of a plurality of cell blocks (for example, first to Nth cell blocks) CB1 to CBN may include a plurality of cell strings. For example, a plurality of cell strings may be connected to one bit line, and in a data program/read operation, one cell string selected from among a plurality of cell strings may be electrically connected to a bit line.

According to an embodiment, each of the plurality of cell blocks CB1 to CBN may include a special word line region including a plurality of special word lines. According to an embodiment, a special word line region of the first cell block CB1 and a special word line region of the Nth cell block CBN may have physically different structures. Alternatively, the special word line region of the first cell block CB1 and the special word line region of the Nth cell block CBN may be differently managed, and for example, management of a plurality of ground selection transistors GST connected to special word lines disposed in the special word line region of the first cell block CB1 and a plurality of ground selection transistors GST connected to special word lines disposed in the special word line region of the Nth cell block CBN may be differently performed. For example, in a manufacturing process of the memory device 100, a plurality of ground selection transistors GST included in each of the plurality of cell blocks CB1 to CBN may be programmed to have certain threshold voltages, and ground selection transistors GST disposed in the special word line region of the first cell block CB1 and ground selection transistors GST disposed in the special word line region of the Nth cell block CBN may be differently programmed.

According to an embodiment, the control logic 110 may include cell block control information 111 (CB CTRL Info). For example, the control logic 110 may include a storage circuit, which non-volatilely stores information, such as a fuse circuit or an anti-fuse circuit, and based on the cell block control information 111, the control logic 110 may control a program operation and an erase operation on a plurality of ground selection transistors GST of the plurality of cell blocks CB1 to CBN. Also, the control logic 110 may control dummy transistors connected to the special word lines of the plurality of cell blocks CB1 to CBN so as to be used as one of a memory cell transistor storing data, a ground selection transistor, and a dummy transistor, based on the cell block control information 111.

In an embodiment, in a manufacturing process of the memory device 100, the cell block control information 111 may be stored in an external storage circuit outside the control logic 110, and in an initial driving process of the memory device 100, the cell block control information 111 may be provided to the control logic 110.

The memory device 100 according to an embodiment may include a plurality of cell blocks, and each of the cell blocks may include the memory cell array 120 which includes a plurality of cell strings connected in parallel between a bit line and a common source line and the control logic 110 which controls a program operation, a read operation, and an erase operation on the memory cell array 120. At least one of the plurality of cell blocks may include a plurality of ground selection transistors connected to a plurality of special word lines. Some of the plurality of ground selection transistors may be programmed with a first threshold voltage, and the other ground selection transistors may be programmed with a second threshold voltage which is higher than the first threshold voltage. The control logic 110 may be configured to perform an erase operation on some of the plurality of ground selection transistors at every N (where N may be an integer of 1 or more) number of erase/program (E/P) cycles from a certain time point (e.g., a first time point) and then program with the first threshold voltage. The control logic 110 may be configured to perform an erase operation on the other ground selection transistors at every N number of E/P cycles from a certain time point and then program with the second threshold voltage. For example, the control logic 110 may be configured to perform an erase operation on some of the plurality of ground selection transistors at every N number of E/P cycles from a $k^{th}$ (where k may be a positive integer) E/P cycle, without threshold voltage monitoring, and then program with the first threshold voltage. The control logic 110 may be configured to perform an erase operation on the other ground selection transistors at every N number of E/P cycles from the $k^{th}$ E/P cycle, without threshold voltage monitoring, and then program with the second threshold voltage. According to an embodiment, k may be 1. According to an embodiment, N may be 1. According to an embodiment, k may be a predetermined value. According to an embodiment, the certain time point may be determined based on the number of predetermined program loops. According to an embodiment, the certain time point may be immediately after exceeding the number of predetermined read on cell blocks. According to an embodiment, the certain time point may be immediately after a predetermined time elapses. According to an embodiment, the control logic 110 may be configured to perform an erase operation on some of a plurality of ground selection transistors and then program with the first threshold voltage, based on monitoring on threshold voltages of the plurality of ground selection transistors until before the certain time point. Also, the control logic 110 may be configured to perform an erase operation on the other ground selection transistors and then program with the second threshold voltage, based on monitoring on the threshold voltages of the plurality of ground selection transistors until before the certain time point. According to an embodiment, the certain time point (e.g., a first time point) may be after an $m^{th}$ (where m may be a positive integer) program fail is confirmed on the first threshold voltage of some of a plurality of ground selection transistors and the second threshold voltage of the other ground selection transistors, based on a threshold voltage monitoring result of the control logic 110.

According to an embodiment, when programming of at least one of the first threshold voltage of some of a plurality of ground selection transistors and the second threshold voltage of the other ground selection transistors fails, the control logic 110 may be configured to perform an erase operation on some of the plurality of ground selection transistors at every N number of erase/program (E/P) cycles and then program with the first threshold voltage, and the control logic 110 may be configured to perform an erase operation on the other ground selection transistors and then program with the second threshold voltage.

According to an embodiment, the plurality of cell blocks may include the first cell block CB1 and the second cell block CB2, and a memory cell level of the first cell block CB1 may be higher than a memory cell level of the second cell block CB2. The control logic 110 may be configured to perform an erase operation on some of a plurality of ground selection transistors of the first cell block CB1 at every N number of E/P cycles from the first time point and then program with the first threshold voltage. The control logic 110 may be configured to perform an erase operation on the other ground selection transistors of the first cell block CB1 at every N number of E/P cycles from the first time point and then program with the second threshold voltage. The control logic 110 may be configured to perform an erase operation on some of a plurality of ground selection transistors of the second cell block CB2 at every N number of E/P cycles from a second time point and then program with the first threshold voltage. The control logic 110 may be configured to perform an erase operation on the other ground selection transistors of the second cell block CB2 at every N number of E/P cycles from the second time point and then program with the second threshold voltage. According to an embodiment, the second time point may be later in time than the first time point.

According to an embodiment, at least one of the cell blocks may further include first dummy transistors connected to upper ground dummy lines of special word lines, second dummy transistors connected to lower ground dummy lines of the special word lines, and third dummy transistors connected to internal ground dummy lines disposed between the special word lines. The control logic 110 may control each of the first dummy transistors and the second dummy transistors to operate as one of a ground selection transistor, a memory cell transistor storing data, and a third dummy transistor from the certain time point. For example, the control logic 110 may control each of the first dummy transistors and the second dummy transistors to operate as one of the ground selection transistor, the memory cell transistor storing the data, and the third dummy transistor from the certain time point, based on the cell block control information 111.

According to an embodiment, at least one of the cell blocks may further include the first dummy transistors connected to the upper ground dummy lines of the special word lines, the second dummy transistors connected to the lower ground dummy lines of the special word lines, and the third dummy transistors connected to the internal ground dummy lines disposed between the special word lines. The control logic 110 may control each of the first dummy transistors and the second dummy transistors to operate as one of the ground selection transistor and the memory cell transistor storing data from the certain time point.

The memory device 100 according to an embodiment may include a plurality of cell blocks, and each of the cell blocks may include a memory cell array 120 which includes a plurality of cell strings connected in parallel between a bit line and a common source line and a control logic 110 which controls a program operation, a read operation, and an erase operation on the memory cell array 120. At least one of the plurality of cell blocks may include a special word line region which includes a plurality of ground selection transistors connected to a plurality of special word lines and a plurality of dummy transistors connected to a plurality of special dummy lines. Some of the plurality of ground selection transistors may be programmed with the first threshold voltage, and the other ground selection transistors may be programmed with the second threshold voltage which is higher than the first threshold voltage. The control logic 110 may perform an erase operation on some of the plurality of ground selection transistors at every N (where N may be an integer of 1 or more) number of E/P cycles from a certain time point and may then be configured to program with the first threshold voltage, and may perform an erase operation on the other ground selection transistors and may then be configured to program with the second threshold voltage. At this time, the number of transistors may decrease from the certain time point.

The memory device 100 according to an embodiment may ensure the operation reliability of the special word line.

The memory device 100 according to an embodiment may use dummy transistors, connected to dummy lines disposed in the special word line region, as one of the memory cell transistor and the ground selection transistor. Accordingly, the degree of integration of memory devices may be enhanced.

The memory device 100 according to an embodiment may reduce an erase time of each of the ground selection transistors.

Figure 2:
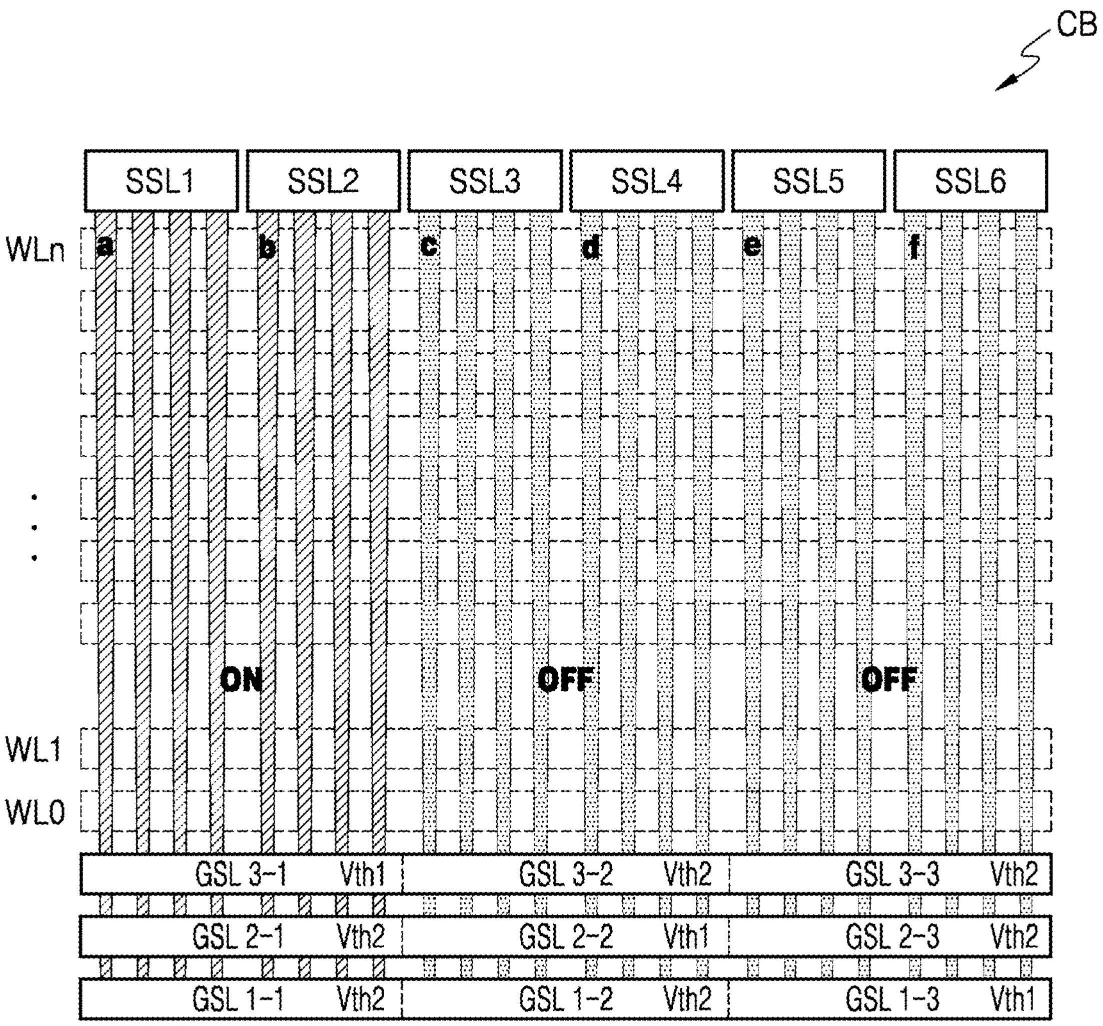
FIG. 2 illustrates a schematic cross-sectional view of a cell block according to an embodiment.

FIG. 2 illustrates a schematic cross-sectional view of a cell block CB according to an embodiment.

Referring to FIG. 2, in an embodiment, first to sixth string selection transistors SSL1 to SSL6 may be provided, and as the first to sixth string selection transistors SSL1 to SSL6 are physically separated from one another, string selection transistors (not shown) connected to the first to sixth string selection transistors SSL1 to SSL6 may be individually controlled.

Furthermore, a plurality of cell strings may be connected to each of the first to sixth string selection transistors SSL1 to SSL6. Also, cell strings (for example, first to sixth cell strings) a to f connected to the first to sixth string selection transistors SSL1 to SSL6 may be connected to one same bit line (not shown) in common. For example, when the first cell string a is selected from among the cell strings a to f of the first to sixth string selection transistors SSL1 to SSL6, a string selection transistor connected to the first string selection transistor SSL1 may be turned on, and thus, the first cell string a may be electrically connected to a bit line and the other cell strings may not be electrically connected to the bit line.

In FIG. 2, for example, it is illustrated by a dotted line that a first ground selection line GSL1 is divided into three regions, but this is for convenience of description, each of first to third ground selection lines GSL1 to GSL3 may be disposed in the first to sixth string selection transistors SSL1 to SSL6 in common. It is to be understood that the number of regions that the ground selection lines may be divided into is not limited to three, and may be less than three (e.g., two) or greater than three (e.g., 4), according to other embodiments.

In an embodiment illustrated in FIG. 2, ground selection transistors connected to each of the first to third ground selection lines GSL1 to GSL3 may be programmed with different threshold voltages on the first to sixth string selection transistors SSL1 to SSL6. For example, in association with the third ground selection line GSL3, ground selection transistors of a third-1 region GSL3-1 corresponding to the first and second string selection lines SSL1 and SSL2 may be programmed with a first threshold voltage Vth1. On the other hand, ground selection transistors of a third-2 region GSL3-2 and a third-3 region GSL3-3 corresponding to the third to sixth string selection lines SSL3 to SSL6 may be programmed with a second threshold voltage Vth2 which is higher than the first threshold voltage Vth1.

Similarly, in association with the second ground selection line GSL2, ground selection transistors of a second-2 region GSL2-2 corresponding to the third and fourth string selection lines SSL3 and SSL4 may be programmed with the first threshold voltage Vth1. On the other hand, ground selection transistors of a second-1 region GSL2-1 and a second-3 region GSL2-3 corresponding to the first and second string selection lines SSL1 and SSL2 and the fifth and sixth string selection lines SSL5 and SSL6 may be programmed with the second threshold voltage Vth2. Also, in association with the first ground selection line GSL1, ground selection transistors of a first-3 region GSL1-3 corresponding to the fifth and sixth string selection lines SSL5 and SSL6 may be programmed with the first threshold voltage Vth1, and ground selection transistors of a first-1 region GSL1-1 and a first-2 region GSL1-2 corresponding to the first to fourth string selection lines SSL1 to SSL4 may be programmed with the second threshold voltage Vth2.

Threshold programming of a GSL region may be referred to as GSL region coding. The first to third ground selection lines GSL1 to GSL3 may be referred to as a special word line. The special word line described below with reference to FIG. 9A may include the GSL region described above. That is, the special word line region may include a coded GSL as described above. The first to third ground selection lines GSL1 to GSL3 of FIG. 2 may be a kind of coded GSL. Also, unlike FIG. 2, the special word line region may further include a special dummy word line between the first to third ground selection lines GSL1 to GSL3 or an adjacent region.

In an embodiment illustrated in FIG. 2, the same ground selection line may be disposed at a height of each of the first to sixth string selection transistors SSL1 to SSL6, but the ground selection line may be electrically disconnected from the first to sixth string selection transistors SSL1 to SSL6, based on GSL region coding. For example, when one of the first and second string selection transistors SSL1 and SSL2 is selected, a ground selection voltage having a level between the first threshold voltage and the second threshold voltage may be provided to the third ground selection line GSL3, and thus, ground selection transistors of the third-1 region GSL3-1 may be turned on and ground selection transistors of the third-2 region GSL3-2 and the third-3 region GSL3-3 may be turned off. Therefore, at least cell strings of the third to sixth string selection transistors SSL3 to SSL6 may be electrically isolated from a common source line, and the third ground selection line GSL3 may be defined as having a structure which is electrically isolated from the first to sixth string selection transistors SSL1 to SSL6, based on a driving method described above.

When one of the third and fourth string selection transistors SSL3 and SSL4 is selected based on an electrical isolation structure described above, a ground selection voltage having a level between the first threshold voltage and the second threshold voltage may be provided to the second ground selection line GSL2, and thus, ground selection transistors of the second-2 region GSL2-2 may be turned on and ground selection transistors of the second-1 region GSL2-1 and the second-3 region GSL2-3 may be turned off. Also, when one of the fifth and sixth string selection transistors SSL5 and SSL6 is selected, a ground selection voltage having a level between the first threshold voltage and the second threshold voltage may be provided to the first ground selection line GSL1, and thus, ground selection transistors of the first-3 region GSL1-3 may be turned on and ground selection transistors of the first-1 region GSL1-1 and the first-2 region GSL1-2 may be turned off.

Furthermore, according to a structure illustrated in FIG. 2, a plurality of ground selection transistors may be vertically disposed in one cell string, and a plurality of ground selection transistors may be disposed between a word line (for example, WL0) and a common source line (not shown) disposed adjacent to a substrate. As may be used herein, the term "vertical" describes a direction perpendicular to an upper surface of the substrate. In this case, all of a plurality of ground selection transistors may be controlled to be turned on in a selected cell string, and at least one of the plurality of ground selection transistors may be controlled to be turned off in an unselected cell string.

In an embodiment illustrated in FIG. 2, a case is illustrated where three ground selection lines are disposed with respect to the first to sixth string selection transistors SSL1 to SSL6, and thus, ground selection lines are electrically isolated from each other by units of two string selection lines. However, the electrical disconnection may be variously implemented, and for example, a various number of ground selection lines may be included in a cell block CB. For example, in a case where two ground selection lines are disposed in the cell block CB, ground selection lines may be electrically isolated from one another by units of three string selection lines. Alternatively, in a case where six ground selection lines are disposed in the cell block CB, a ground selection line may be electrically isolated by units of each (or one) string selection line. That is, in a case where a ground selection line is electrically isolated by units of one string selection line, in one ground selection line connected to a plurality of cell strings in common, only a ground selection transistor disposed in a selected cell string may be selectively turned on, and ground selection transistors disposed in the other unselected cell strings may be turned off, whereby an electrical isolation characteristic may be enhanced.

In an embodiment illustrated in FIG. 2, it may be described that ground selection transistors of a GSL region are programmed with the first threshold voltage or the second threshold voltage, but an embodiment is not limited thereto. For example, the first threshold voltage may correspond to a voltage having an erase state, and in this case, a program operation may not be performed on a ground selection transistor having the first threshold voltage.

Figure 3:
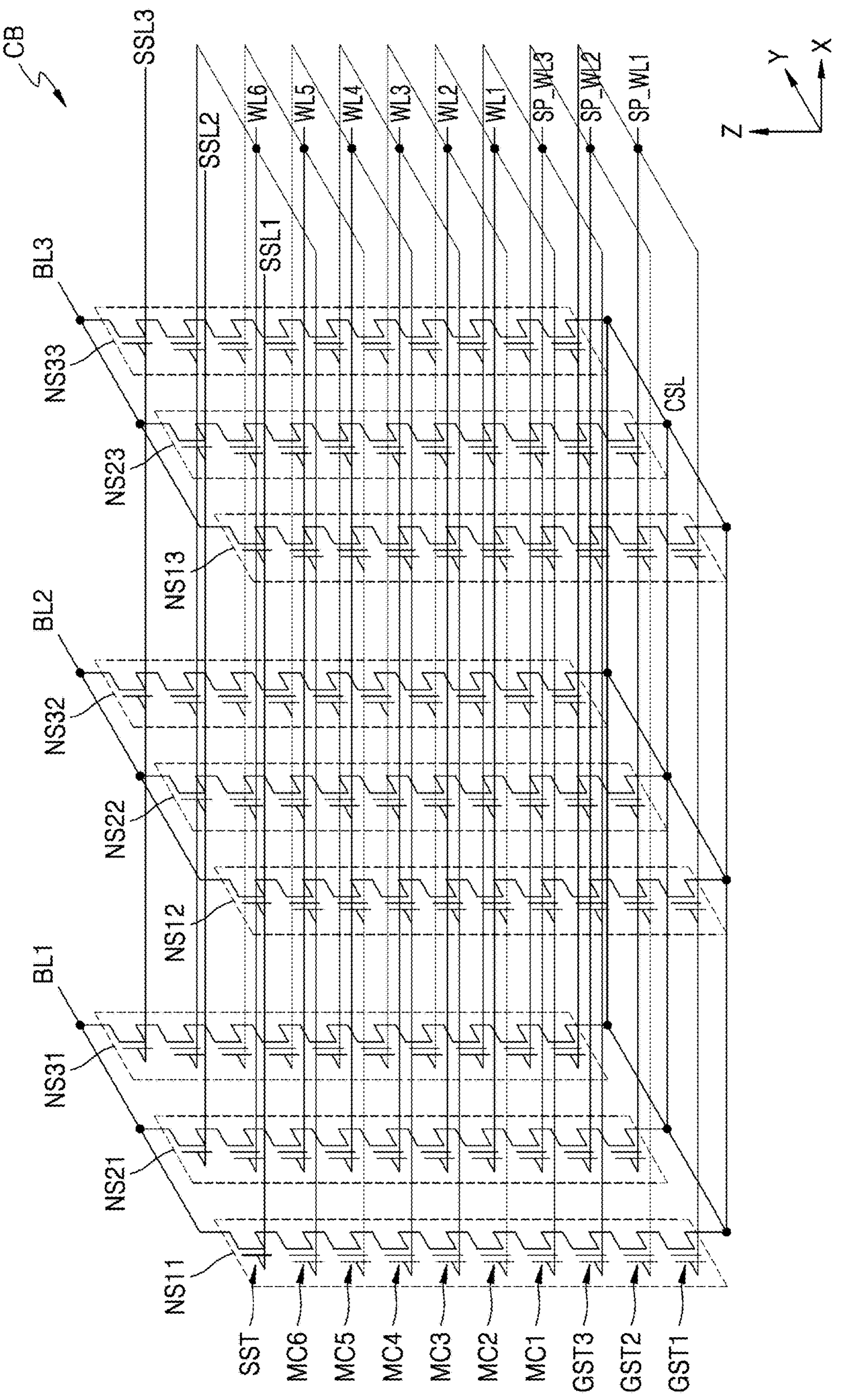
FIG. 3 illustrates a schematic circuit diagram of a cell block according to an embodiment.

FIG. 3 illustrates a circuit diagram of a cell block CB according to an embodiment.

FIG. 3 may be described with reference to FIG. 1. Each of a plurality of cell blocks may be expressed as an equivalent circuit as illustrated in FIG. 3. The cell block CB illustrated in FIG. 3 may represent a three-dimensional (3D) cell block formed in a 3D structure on a substrate. For example, a plurality of memory NAND strings included in the cell block CB may be formed in a direction perpendicular to an upper surface of the substrate.

Referring to FIG. 3, the cell block CB may include a plurality of memory NAND strings NS11 to NS33 connected between bit lines BL1 to BL3 and a common source line CSL. Each of the plurality of memory NAND strings NS11 to NS33 may include a string selection transistor SST, a plurality of memory cells MC1 to MC6, and ground selection transistors GST1 to GST3. In FIG. 3, each of the plurality of memory NAND strings NS11 to NS33 is illustrated as including six memory cells MC1 to MC6, but an embodiment is not limited thereto. Moreover, in FIG. 3, each of the plurality of memory NAND strings NS11 to NS33 is illustrated as including three ground selection transistors GST1 to GST3, but an embodiment is not limited thereto.

A string selection transistor SST may be connected to corresponding string selection lines SSL1 to SSL3. A plurality of memory cells MC1 to MC6 may be respectively connected to corresponding word lines WL1 to WL6. Some of special word lines SP_WL1 to SP_WL3 and the word lines WL1 to WL6 may correspond to dummy word lines.

Each of the ground selection transistors GST1 to GST3 may be connected to a corresponding special word line. The string selection transistor SST may be connected to corresponding bit lines BL1 to BL3, and the ground selection transistor GST may be connected to the common source line CSL.

A word line and a special word line each having the same vertical height (i.e., in the Z-direction), relative to the upper surface of the substrate as a reference layer, may be connected in common. The string selection lines SSL1 to SSL3 may be isolated from one another. In FIG. 3, it is illustrated that the cell block CB is connected to six word lines WL1 to WL6, three special word lines SP_WL1 to SP_WL3, and three bit lines BL1 to BL3, but an embodiment is not limited thereto.

Figure 4:
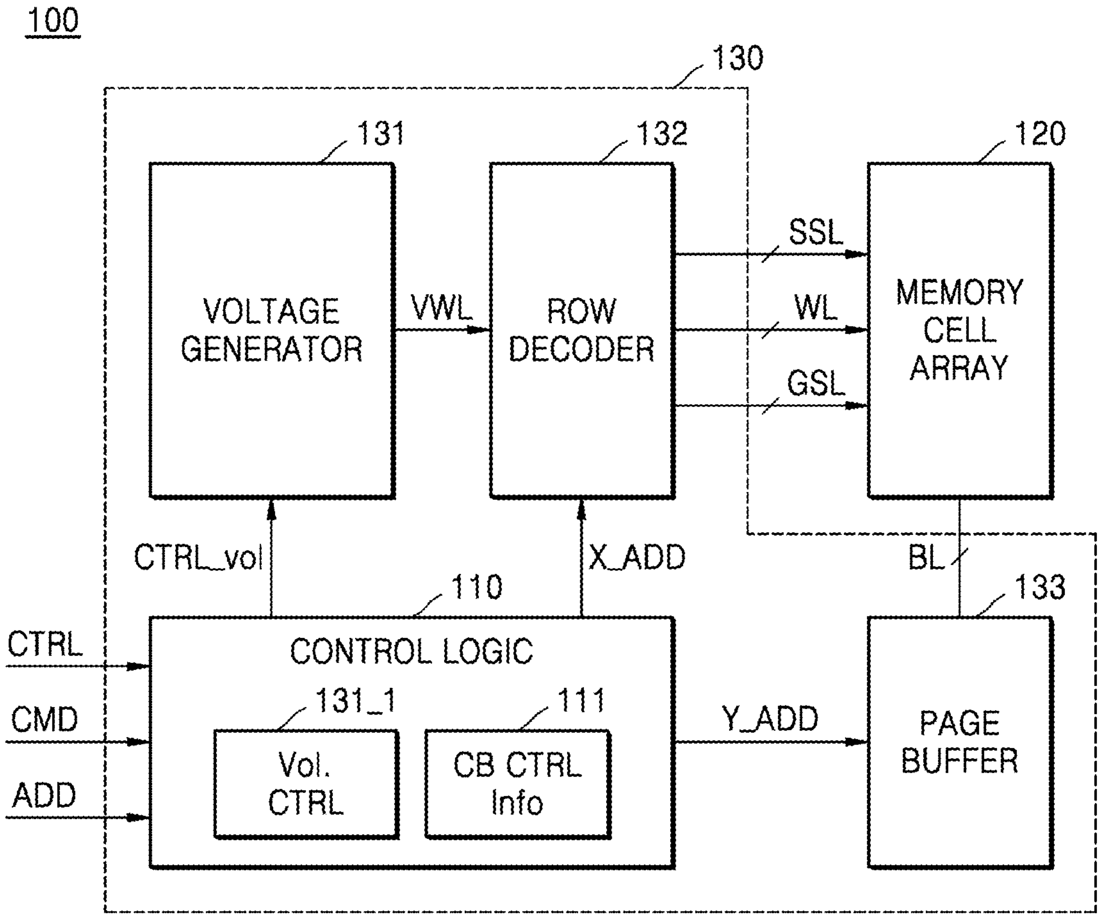
FIG. 4 illustrates a block diagram of an example memory device according to an embodiment.

FIG. 4 illustrates a block diagram of an example memory device 100 according to an embodiment.

Referring to FIG. 4, the memory device 100 may include a memory cell array 120 and a peripheral circuit 130, and the peripheral circuit 130 may include a control logic 110, a voltage generator 131, a row decoder 132, and a page buffer 133. Although not shown in FIG. 4, the peripheral circuit 130 may further include various elements such as a data input/output (I/O) circuit or an I/O interface.

The memory cell array 120 may be connected to the page buffer 133 through bit lines BL and may be connected to the row decoder 132 through word lines WL, string selection lines SSL, and ground selection lines GSL. The memory cell array 120 may include a plurality of cell blocks, and each of the plurality of cell blocks may include a plurality of cell strings.

The control logic 110 may be configured to program data in the memory cell array 120, based on a command CMD, an address ADD, and a control signal CTRL supplied to the control logic 110 (e.g., from an external host), and may output various control signals (for example, a voltage control signal CTRL_vol, a row address X_ADD, and a column address Y_ADD) for reading the data from the memory cell array 120. The control logic 110 may include cell block control information 111 (CB CTRL Info) and a voltage controller 131_1 (Vol. CTRL) which adjusts a level of a voltage generated by the voltage generator 131. In FIG. 4, it is illustrated that the voltage controller 131_1 is included in the control logic 110, but an embodiment is not limited thereto and it may be described that the voltage controller 131_1 is provided outside the control logic 110.

The voltage generator 131 may generate various kinds of voltages for performing a program operation, a read operation, and an erase operation on the memory cell array 120, based on the voltage control signal CTRL_vol. In FIG. 4, it is illustrated that the voltage generator 131 generates a word line voltage VWL, and the word line voltage VWL may be a concept which includes a voltage provided to word lines WL of the memory cell array 120, a voltage provided to a string selection line, and a voltage provided to a ground selection line.

Figure 5:
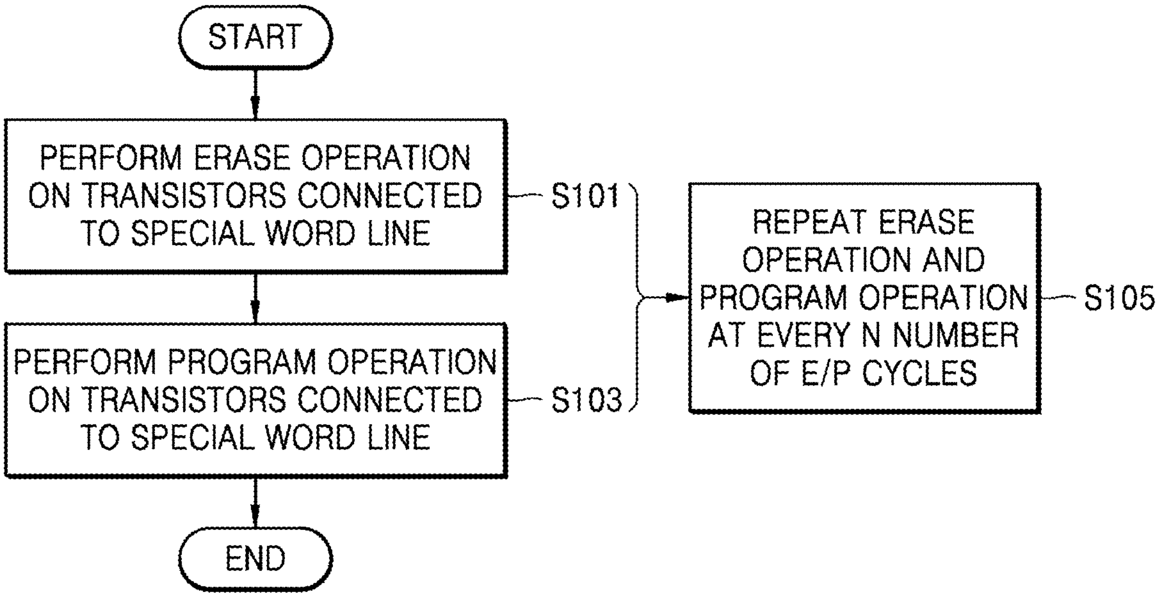
FIG. 5 illustrates an operation of a memory device according to an embodiment.

FIG. 5 illustrates an operation of the memory device 100 of FIGS. 1 and 4 according to an embodiment. FIG. 5 may be described with reference to FIGS. 1 and 2.

Referring to FIG. 5, in operation S101, the memory device 100 may perform an erase operation on transistors connected to a special word line.

In operation S103, the memory device 100 may perform a program operation on the transistors connected to the special word line. The program operation may be performed after the erase operation of operation S101. For example, the memory device 100 may perform an erase operation after performing pre-programming on the transistors connected to the special word line for erasing, perform an erase verify operation after the erase operation is performed, and perform a program operation after the erase verify operation is performed.

In operation S105, the memory device 100 may repeat an erase operation and a program operation at every N (where N may be a positive integer) number of E/P cycles. That is, the memory device 100 may repeat operation S101 and operation S103 at every N number of E/P cycles.

While the memory device 100 repeats operation S101 and operation S103 at every N number of E/P cycles, the memory device 100 may not need to check (monitor) a pass or a fail of a threshold voltage for operations of transistors connected to special word lines. That is, the memory device 100 may mechanically repeat an erase operation and a program operation on a transistor connected to periodically coded ground selection lines (coded-GSL), thereby increasing the reliability of a coded ground selection line (coded-GSL) without threshold voltage monitoring.

Figure 6:
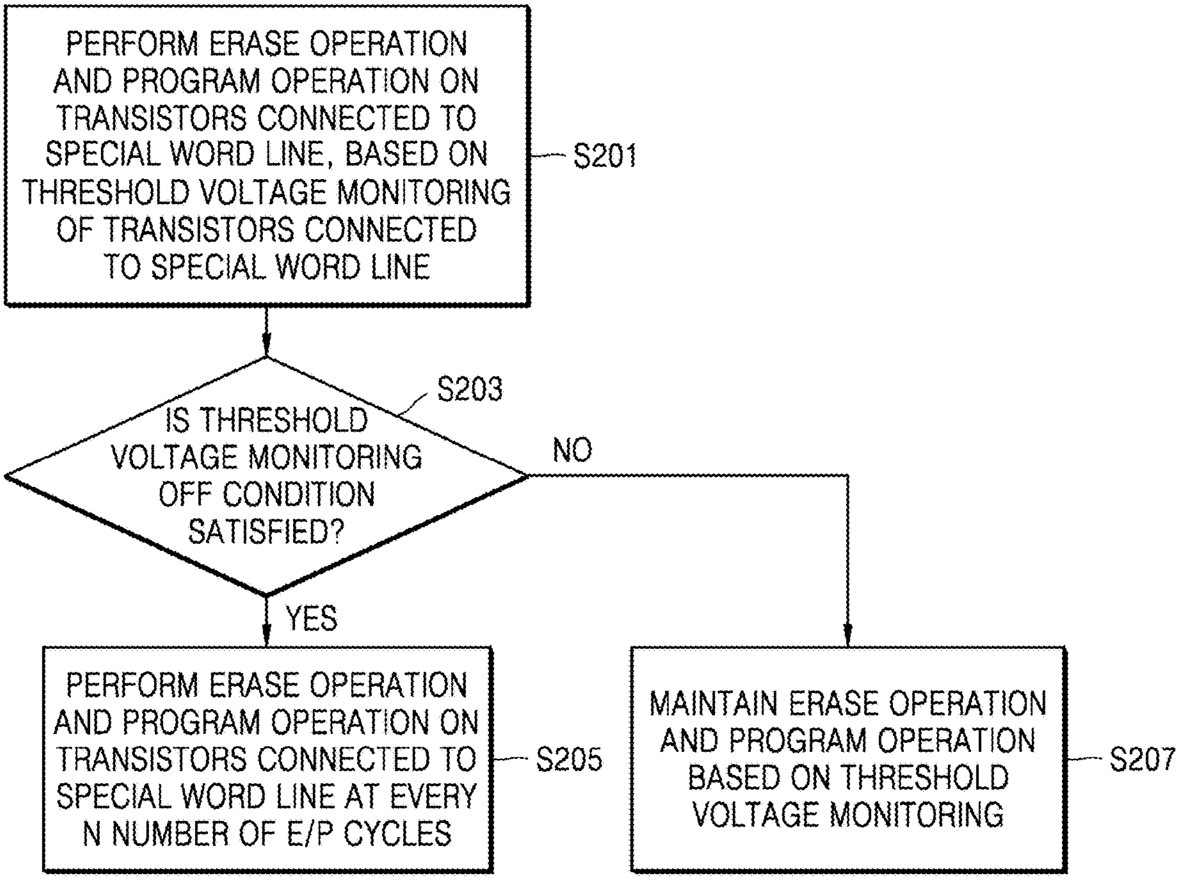
FIG. 6 illustrates an operation of a memory device according to an embodiment.

FIG. 6 illustrates an operation of the memory device 100 of FIGS. 1 and 4 according to an embodiment. FIG. 6 may be described with reference to FIGS. 1 and 2.

Referring to FIG. 6, in operation S201, the memory device 100 may perform an erase operation and a program operation on transistors connected to a special word line, based on threshold voltage monitoring of the transistors connected to the special word line. For example, the memory device 100 may perform a verify operation on a threshold voltage of each of the transistors connected to the special word line. That is, the memory device 100 may perform a verify operation on a first threshold voltage of some of the transistors and a second threshold voltage of the other transistors. When a value of a fail bit of a cell block is greater than or equal to a reference bit, the memory device 100 may perform a re-write operation on the transistors connected to the special word line. The fail bit may denote the number of on cells which do not reach a target threshold voltage having a program state.

In operation S203, the memory device 100 may determine whether to satisfy a threshold voltage monitoring OFF condition. The threshold voltage monitoring OFF condition may be variously implemented, and embodiments of the threshold voltage monitoring OFF condition will be described below with reference to FIGS. 7A to 7D.

In operation S205, when the threshold voltage monitoring OFF condition is satisfied, the memory device 100 may perform an erase operation and a program operation on the transistors connected to the special word line at every N number of E/P cycles.

In operation S207, when the threshold voltage monitoring OFF condition is not satisfied, the memory device 100 may maintain an erase operation and a program operation each based on the threshold voltage monitoring.

FIGS. 7A to 7D illustrate threshold voltage monitoring OFF conditions according to an embodiment. FIGS. 7A to 7D may be described with reference to FIG. 1.

Figure 7A:
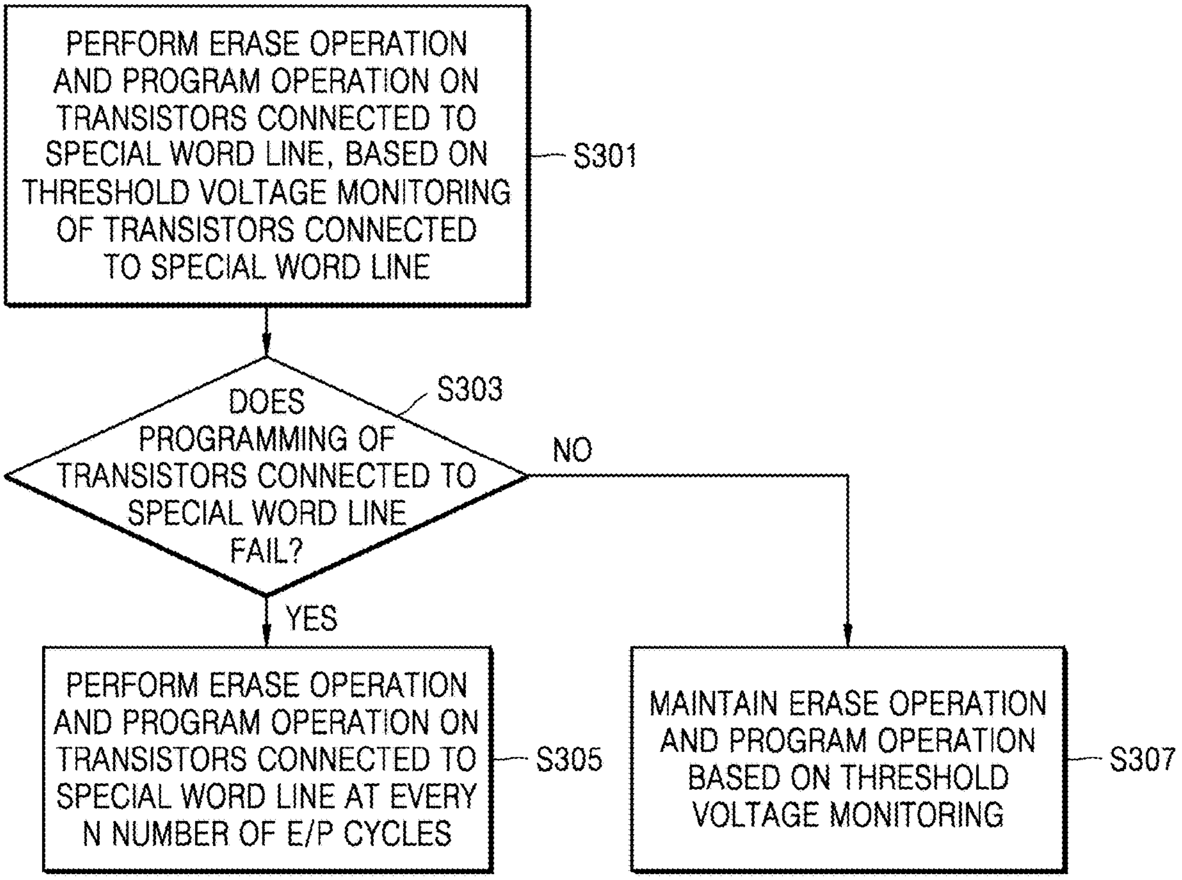
FIGS. 7A to 7D illustrate threshold voltage monitoring OFF conditions according to an embodiment.

Referring to FIG. 7A, in operation S301, the memory device 100 may perform an erase operation and a program operation on transistors connected to a special word line, based on threshold voltage monitoring of the transistors connected to the special word line.

In operation S303, the memory device 100 may fail in programming of the transistors connected to the special word line.

In operation S305, when the programming of the transistors connected to the special word line fails, the memory device 100 may perform an erase operation and a program operation on the transistors connected to the special word line at every N number of E/P cycles, without threshold voltage monitoring. That is, when the programming of the transistors connected to the special word line fails, the memory device 100 may turn off the threshold voltage monitoring. In operation S307, when the programming of the transistors connected to the special word line does not fail, the memory device 100 may maintain an erase operation and a program operation each based on the threshold voltage monitoring.

For example, when the number of cell blocks where the programming of the transistors connected to the special word line fails is more than or equal to an 'n' (where n may be a positive integer) number, the memory device 100 may turn off the threshold voltage monitoring and may perform an erase operation and a program operation on the transistors connected to the special word line at every N number of E/P cycles. Here, n may be previously set.

The memory device 100 may perform an erase operation and a program operation on the transistors connected to the special word line, based on threshold voltage monitoring of the transistors connected to the special word line until a certain time point.

Figure 7B:
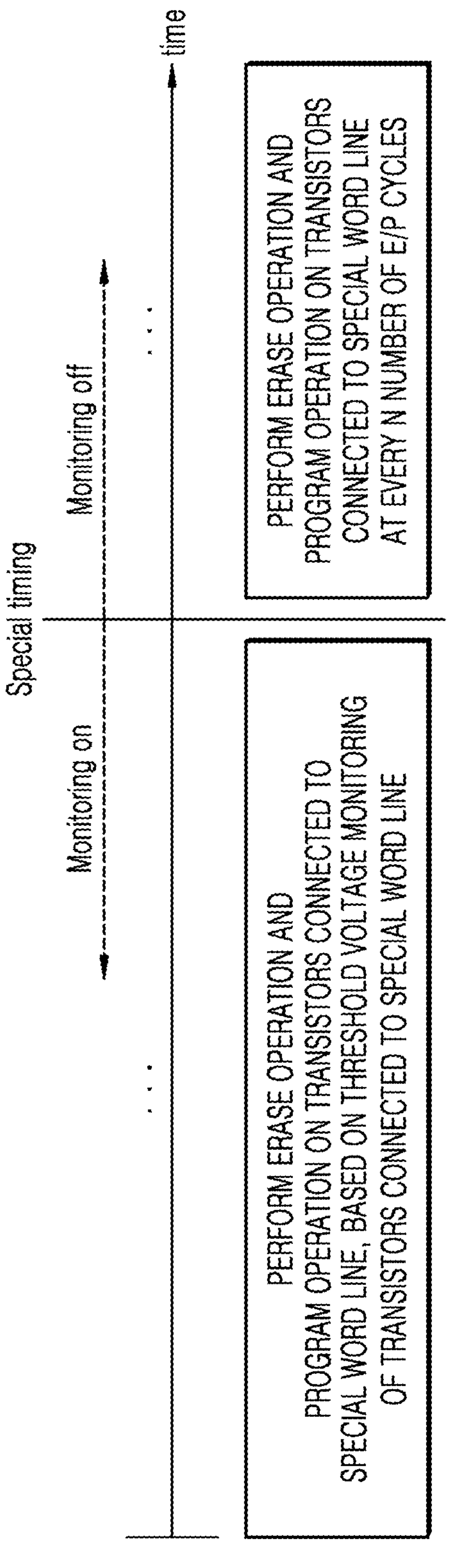

Referring to FIG. 7B, the memory device 100 may perform an erase operation and a program operation on the transistors connected to the special word line, based on the threshold voltage monitoring of the transistors connected to the special word line until before a predetermined certain time point (special timing). The memory device 100 may perform an erase operation and a program operation on the transistors connected to the special word line at every N number of E/P cycles from after the predetermined special timing. In detail, the memory device 100 may perform an erase operation and a program operation on the transistors connected to the special word line at every N number of E/P cycles, after the special timing which is a predetermined time elapses from a time at which the memory device 100 starts to be used. The memory device 100 may perform an erase operation and a program operation on the transistors connected to the special word line at every N number of E/P cycles from an E/P cycle which is immediately after the special timing elapses. According to an embodiment, the certain time point may denote a predetermined use time of the memory device 100.

Figure 7C:
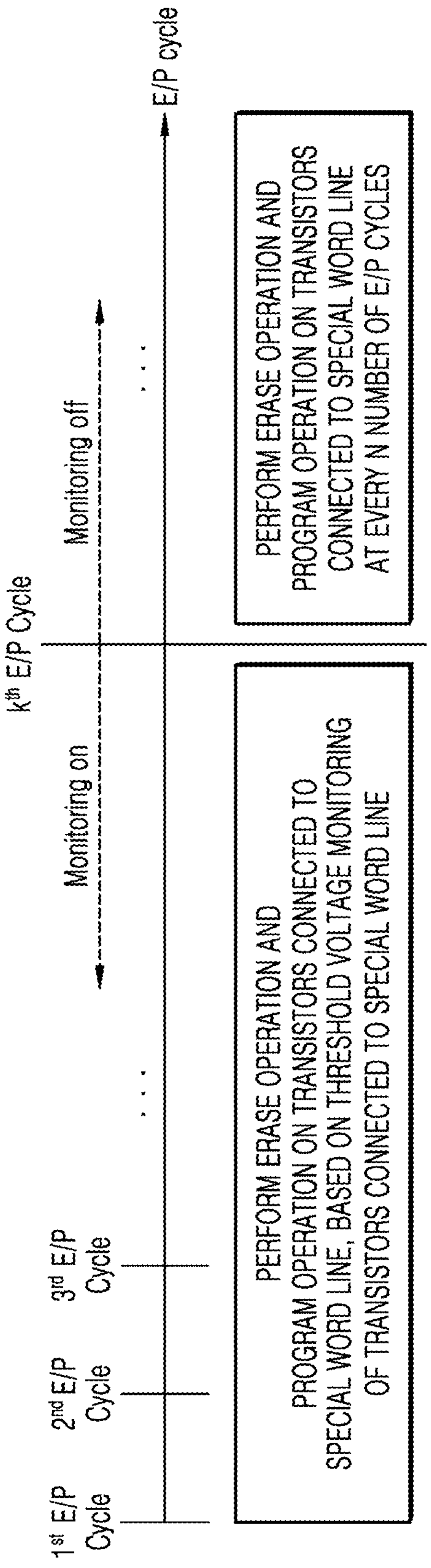

Referring to FIG. 7C, for example, the memory device 100 may perform an erase operation and a program operation on the transistors connected to the special word line, based on the threshold voltage monitoring of the transistors connected to the special word line until before a predetermined $k^{th}$ E/P cycle (i.e., up to a $(k-1)^{th}$ E/P cycle from a $1^{st}$ E/P cycle). The memory device 100 may perform an erase operation and a program operation on the transistors connected to the special word line at every N number of E/P cycles from the predetermined $k^{th}$ E/P cycle and thereafter. For example, the memory device 100 may perform an erase operation and a program operation on ground selection transistors connected a coded GSL at every N number of E/P cycles from the predetermined $k^{th}$ E/P cycle. That is, entering the predetermined $k^{th}$ E/P cycle may be a threshold voltage monitoring OFF condition.

Figure 7D:
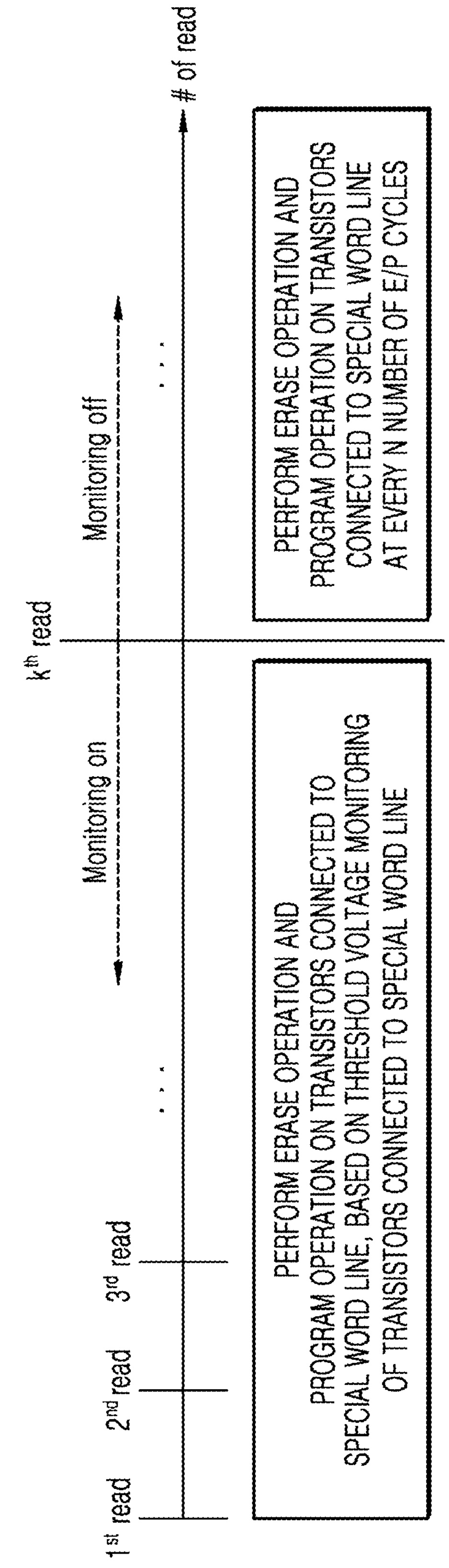

Referring to FIG. 7D, the memory device 100 may perform an erase operation and a program operation on the transistors connected to the special word line, based on the threshold voltage monitoring of the transistors connected to the special word line until before exceeding the predetermined number (k) of reads (the number of read cycles). The memory device 100 may perform an erase operation and a program operation on the transistors connected to the special word line at every N number of E/P cycles from after exceeding the predetermined number of read. In detail, when the number of read on cell blocks by the memory device 100 is more than a predetermined number, the memory device 100 may perform an erase operation and a program operation on the transistors connected to the special word line at every N number of E/P cycles from an E/P cycle immediately after exceeding the number of read.

Figure 8:
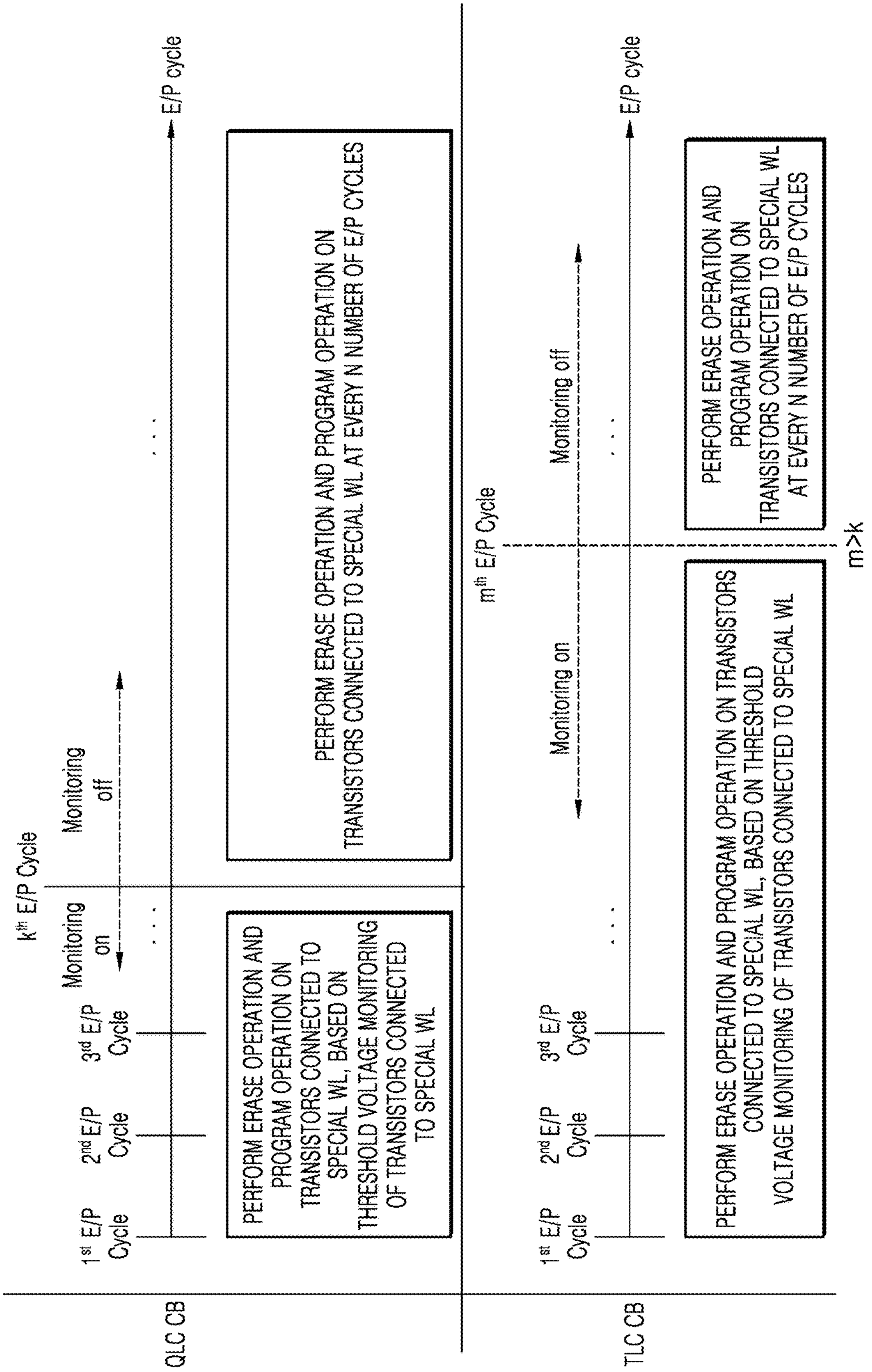
FIG. 8 illustrates a threshold voltage monitoring OFF time with respect to a memory cell level, according to an embodiment.

FIG. 8 illustrates a threshold voltage monitoring OFF time with respect to a memory cell level, according to an embodiment. FIG. 8 may be described with reference to FIG. 1. FIG. 8 may be described based on an embodiment where the certain time point described above with reference to FIG. 1 is the $k^{th}$ E/P cycle, and an embodiment is not limited thereto.

Memory cells of each cell block may correspond to one of a single-level cell (SLC), a multi-level cell (MLC), a triple-level cell (TLC), and a quadruple-level cell (QLC). The memory device 100 may turn off threshold voltage monitoring of transistors earlier connected to a special word line as levels of memory cells of a cell block increase.

Referring to FIG. 8, in a cell block CB including QLCs, the memory device 100 may turn off threshold voltage monitoring of the transistors connected to the special word line from a $k^{th}$ E/P cycle and thereafter. That is, the memory device 100 may perform an erase operation and a program operation on the transistors connected to the special word line of the cell block CB including QLCs at every N number of E/P cycles from the $k^{th}$ E/P cycle.

On the other hand, in a cell block CB including TLCs, the memory device 100 may turn off the threshold voltage monitoring of transistors connected to a special word line from an $m^{th}$ (where m may be a positive integer) E/P cycle and thereafter. That is, the memory device 100 may perform an erase operation and a program operation on the transistors connected to the special word line of the cell block CB including TLCs at every N number of E/P cycles from the $m^{th}$ E/P cycle, without threshold voltage monitoring. Here, m may be greater than k, and for example, the memory device 100 may turn off threshold voltage monitoring of transistors earlier connected to a special word line as levels of memory cells of a cell block increase.

The memory device 100 may turn off threshold voltage monitoring of transistors connected to a special word line from the predetermined $k^{th}$ E/P cycle. Here, k may decrease as levels of memory cells of a cell block increase. The memory device 100 may turn off threshold voltage monitoring of transistors connected to a special word line from an E/P cycle immediately after a predetermined special timing. Here, the special timing may be earlier as levels of memory cells of a cell block increase. The memory device 100 may turn off threshold voltage monitoring of transistors connected to a special word line from an E/P cycle immediately after exceeding the predetermined number of reads. Here, the predetermined number of reads may decrease as levels of memory cells of a cell block increase.

FIG. 8 has been described on a QLC and a TLC, but an embodiment is not limited to the cell levels described above.

Figure 9:
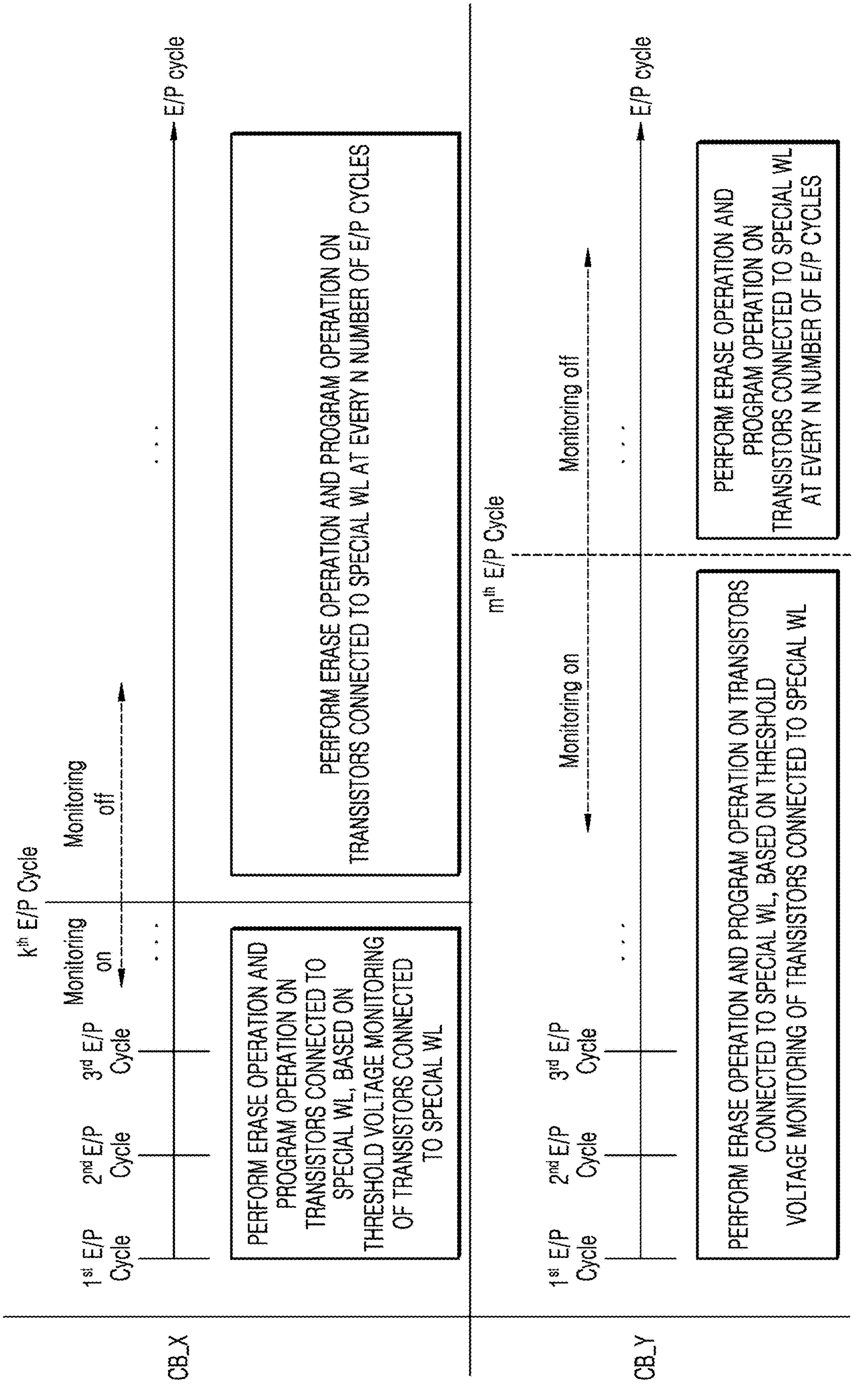
FIG. 9 illustrates a threshold voltage monitoring OFF time with respect to a number of memory program loops, according to an embodiment.

FIG. 9 illustrates a threshold voltage monitoring OFF time with respect to the number of memory program loops, according to an embodiment. FIG. 9 may be described with reference to FIG. 1. FIG. 9 may be described based on an embodiment where the certain time point described above with reference to FIG. 1 is the $k^{th}$ E/P cycle, and an embodiment is not limited thereto.

The memory device 100 may turn off threshold voltage monitoring of transistors earlier connected to a special word line as the number of program loops increases.

Referring to FIG. 9, in a cell block CB_X which is controlled to include X (where X may be a positive integer) number of program loops in a program operation, the memory device 100 may turn off threshold voltage monitoring of transistors connected to a special word line from a $k^{th}$ E/P cycle and thereafter. That is, the memory device 100 may perform an erase operation and a program operation on the transistors connected to the special word line of the cell block CB_X at every N number of E/P cycles from the $k^{th}$ E/P cycle, without threshold voltage monitoring.

On the other hand, in a cell block CB_Y which is controlled to include Y (where Y may be a positive integer) number of program loops in a program operation, the memory device 100 may turn off threshold voltage monitoring of transistors connected to a special word line from an $m^{th}$ (where m may be a positive integer) E/P cycle and thereafter. That is, the memory device 100 may perform an erase operation and a program operation on the transistors connected to the special word line of the cell block CB_Y at every N number of E/P cycles from the $m^{th}$ E/P cycle, without threshold voltage monitoring. Here, m may be greater than k, and for example, the memory device 100 may turn off threshold voltage monitoring of transistors earlier connected to a special word line as the number of program loops of a cell block increases.

The memory device 100 may turn off threshold voltage monitoring of transistors connected to a special word line from the predetermined $k^{th}$ E/P cycle. Here, k may decrease as the number of program loops of a cell block increases. The memory device 100 may turn off threshold voltage monitoring of transistors connected to a special word line from an E/P cycle immediately after a predetermined special timing. Here, the special timing may be earlier as the number of program loops of a cell block increases. The memory device 100 may turn off threshold voltage monitoring of transistors connected to a special word line from an E/P cycle immediately after exceeding the predetermined number of read. Here, the predetermined number of read may decrease as the number of program loops of a cell block increases.

Figure 10A:
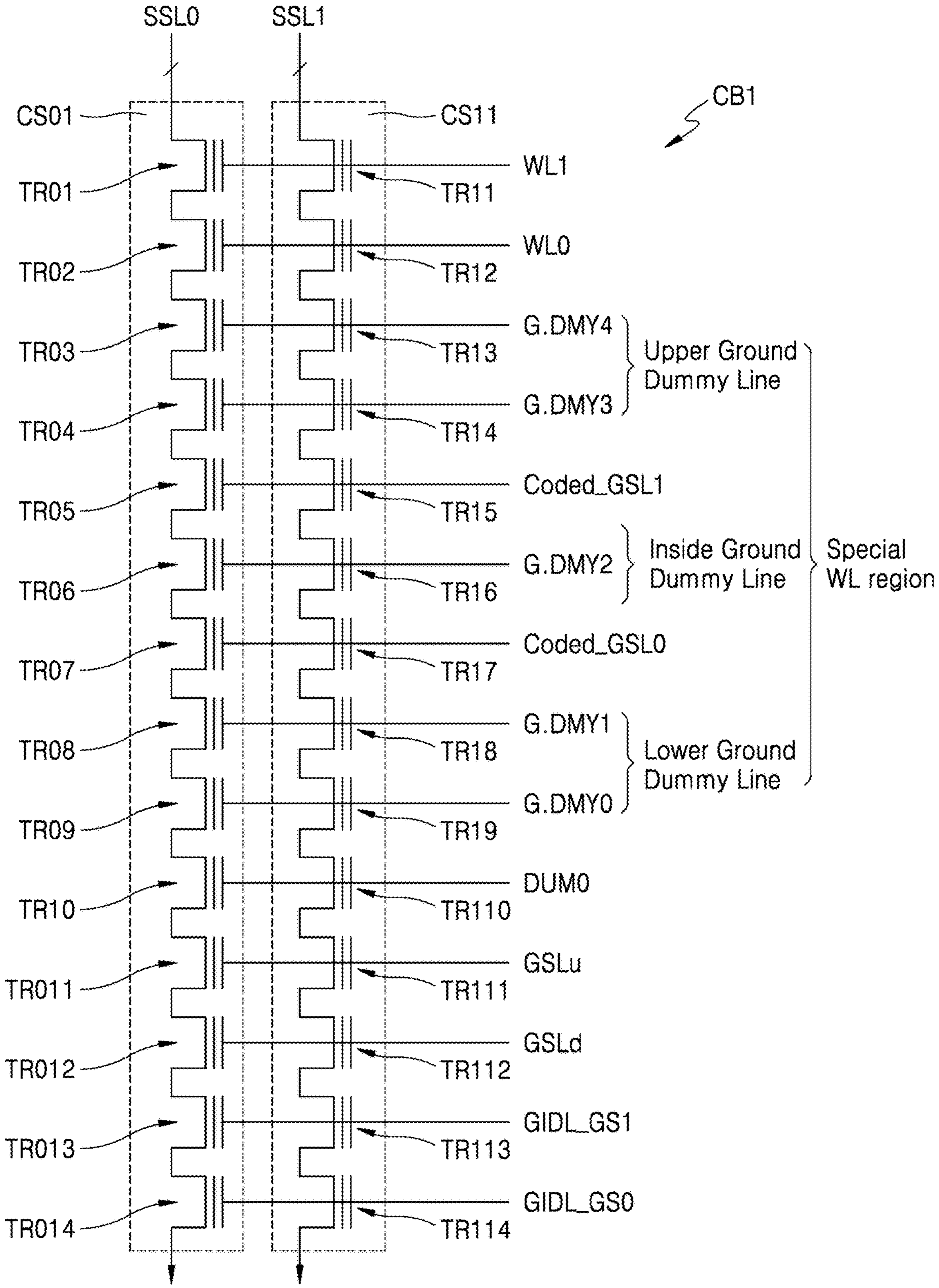
FIGS. 10A to 10C illustrate schematic circuit diagrams of an example cell block included in a memory device according to an embodiment.
Figure 10B:
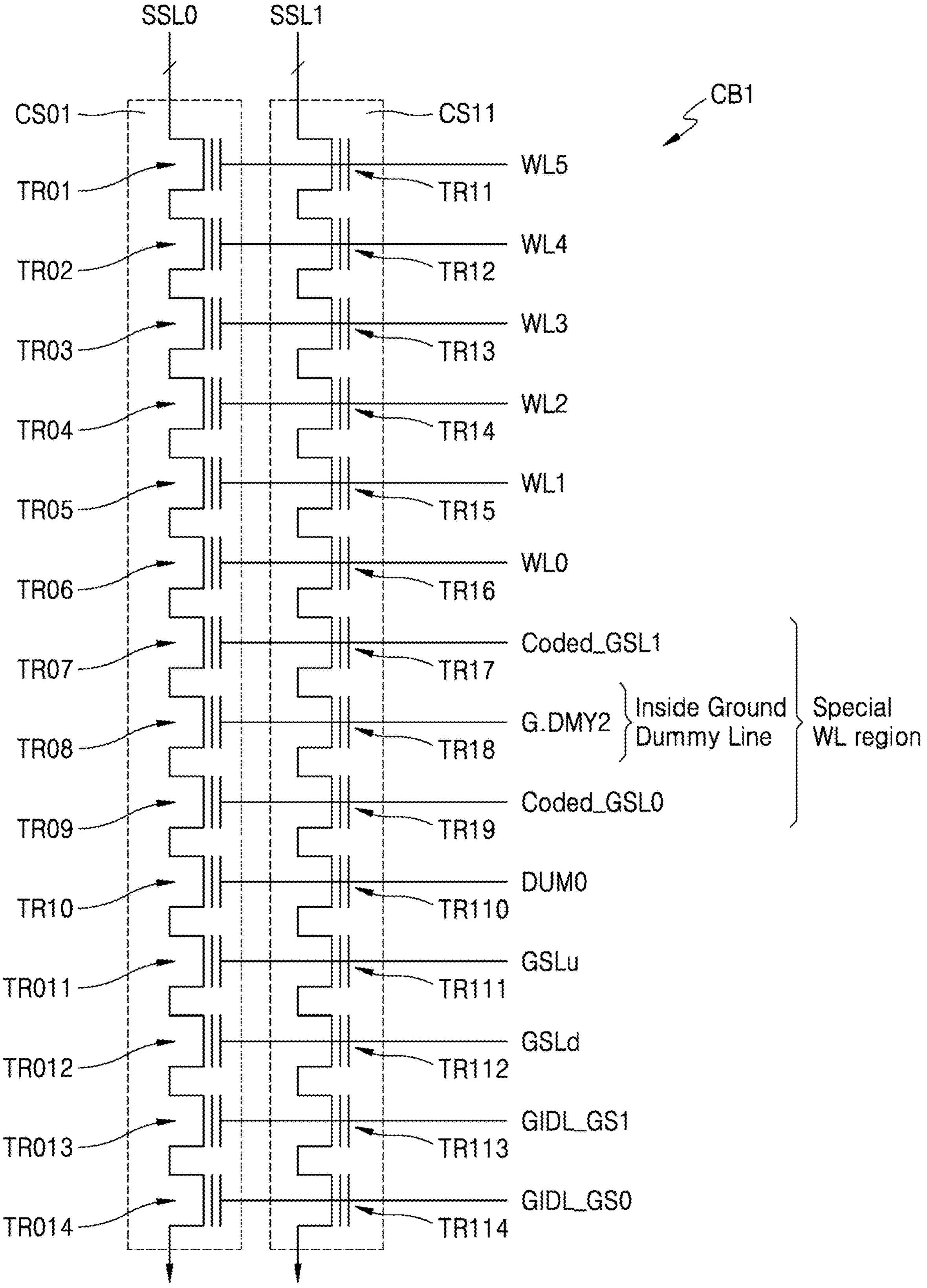
Figure 10C:
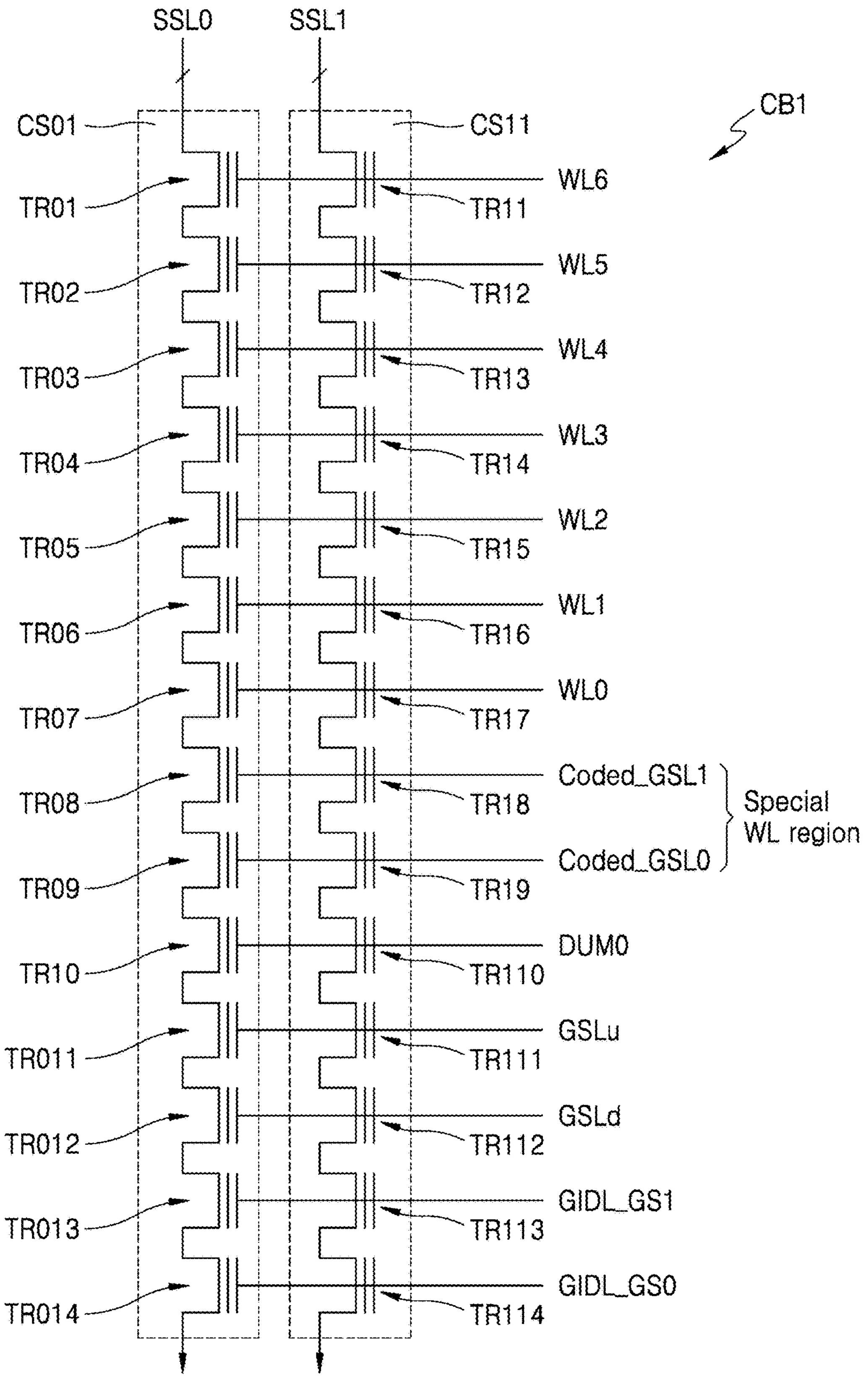

FIGS. 10A to 10C illustrate a cell block included in the memory device 100 of FIG. 1 according to an embodiment. FIGS. 10A to 10C may be described with reference to FIG. 1. Hereinafter, a first cell block CB1, which is an embodiment, of cell blocks will be described.

The first cell block CB1 will be described. However, cell blocks included in the memory device 100 are not limited thereto, and the memory device 100 may further include a plurality of cell blocks. Also, the memory device 100 according to an embodiment may be a 3D memory device.

FIG. 10A illustrates a first architecture of the first cell block CB1. Referring to FIG. 10A, the first cell block CB1 according to an embodiment may include a plurality of cell string regions CS01 and CS11, and the cell string regions CS01 and CS11 may be respectively connected to string selection lines SSL0 and SSL1. For example, the first cell block CB1 may include a first cell string region CS01 and a second cell string region CS11. However, the number of cell string regions is not limited thereto, and the first cell block CB1 may further include a plurality of cell string regions. Also, the first cell string region CS01 may be connected to the first string selection line SSL0, and the second cell string region CS11 may be connected to the second string selection line SSL1.

The first and second cell string regions CS01 and CS11 according to an embodiment may include a first plurality of transistors TR01 to TR014 and a second plurality of transistors TR11 to TR114. For example, the first and second cell string regions CS01 and CS11 according to an embodiment may include the first plurality of transistors TR01 to TR014 and the second plurality of transistors TR11 to TR114, respectively. The number of transistors is not limited to the embodiment described above, and the first and second cell string regions CS01 and CS11 may further include transistors. For example, the first and second cell string regions CS01 and CS11 may further include transistors for storing data.

The first cell string region CS01 and the second cell string region CS11 according to an embodiment may be connected to each other through a word line. For example, the transistors of the first cell string region CS01 and the second cell string region CS11 may be respectively connected to different word lines (WL0 and WL1). Also, the first cell string region CS01 and the second cell string region CS11 may be connected to each other through a special word line.

The first cell block CB1 may further include one or more ground selection lines GSLu and GSLd, and moreover, the first cell block CB1 may further include one or more erase control lines GIDL_GS0 and GIDL_GS1. The ground selection lines GSLu and GSLd may be lines to which the GSL region coding described above is not applied, and ground selection transistors connected to the ground selection lines GSLu and GSLd may not be programmed or may be programmed with the same threshold voltage on the first and second cell string regions CS01 and CS11. Also, the erase control lines GIDL_GS0 and GIDL_GS1 may cause gate induced drain leakage (GIDL) and may thus be disposed for enhancing an erase characteristic of the first cell block CB1, and for example, an erase voltage may be provided to a channel through the transistors connected to the erase control lines GIDL_GS0 and GIDL_GS1.

Lower ground dummy lines G.DMY0 and G.DMY1, ground selection lines Coded_GSL0 and Coded_GSL1, an internal ground dummy line G.DMY2, and upper ground dummy lines G.DMY3 and G.DMY4 may be disposed in a special word line region. Lines disposed in the special word line region may be referred to as a special word line. The number of lower ground dummy lines, ground selection lines, internal ground dummy lines, and upper ground dummy lines may be variously implemented and is not limited to the embodiment. In an embodiment, transistors connected to the lower ground dummy lines G.DMY0 and G.DMY1, the internal ground dummy line G.DMY2, and the upper ground dummy lines G.DMY3 and G.DMY4 may be referred to as a dummy transistor. Transistors connected to the ground selection lines Coded_GSL0 and Coded_GSL1 may be referred to as a ground selection transistor.

Some of word lines according to an embodiment may be configured with the ground selection lines Coded_GSL0 and Coded_GSL1 where a ground selection function is programmed. For example, the ground selection lines Coded_GSL0 and Coded_GSL1 may be programmed to have different threshold voltages and may control whether to activate transistors of each cell string region.

The lower ground dummy lines G.DMY0 and G.DMY1 may be between the ground selection line Coded_GSL0 and an adjacent ground selection line GSL.u. The upper ground dummy lines G.DMY3 and G.DMY4 may be between the ground selection line Coded_GSL1 and an adjacent word line WL0. An internal ground dummy line DUM2 may be between the ground selection line Coded_GSL0 and the ground selection line Coded_GSL1. Because the lower ground dummy lines G.DMY0 and G.DMY1, the ground selection lines Coded_GSL0 and Coded_GSL1, the internal ground dummy line G.DMY2, and the upper ground dummy lines G.DMY3 and G.DMY4 are provided, the memory device 100 according to an embodiment may perform stable program, erase, and read operations.

FIG. 10B illustrates a second architecture of the first cell block CB1. Referring to FIG. 10B, ground selection lines Coded_GSL0 and Coded_GSL1 and an internal ground dummy line G.DMY2 may be disposed in a special word line region. Lines disposed in the special word line region may be referred to as a special word line. The number of ground selection lines and internal ground dummy lines may be variously implemented and is not limited to the embodiment. In the second structure, the lower ground dummy lines G.DMY0 and G.DMY1 and the upper ground dummy lines G.DMY3 and G.DMY4 may not be provided in the special word line region. Therefore, the first cell block CB1 may include more word lines (WL0 to WL5) and memory cells compared to the architecture shown in FIG. 10A. Accordingly, the degree of integration of the memory device 100 may be enhanced.

FIG. 10C illustrates a third architecture of the first cell block CB1. Referring to FIG. 10C, ground selection lines Coded_GSL0 and Coded_GSL1 may be disposed in a special word line region. Lines disposed in the special word line region may be referred to as a special word line. The number of ground selection lines may be variously implemented and is not limited to the embodiment. In the third structure, the lower ground dummy lines G.DMY0 and G.DMY1, the upper ground dummy lines G.DMY3 and G.DMY4, and the internal ground dummy line G.DMY2 may not be provided in the special word line region. Therefore, the first cell block CB1 may include more word lines (WL0 to WL6) and memory cells compared to the architecture shown in FIG. 10A or 10B. Accordingly, the degree of integration of the memory device 100 may be enhanced.

Figure 11A:
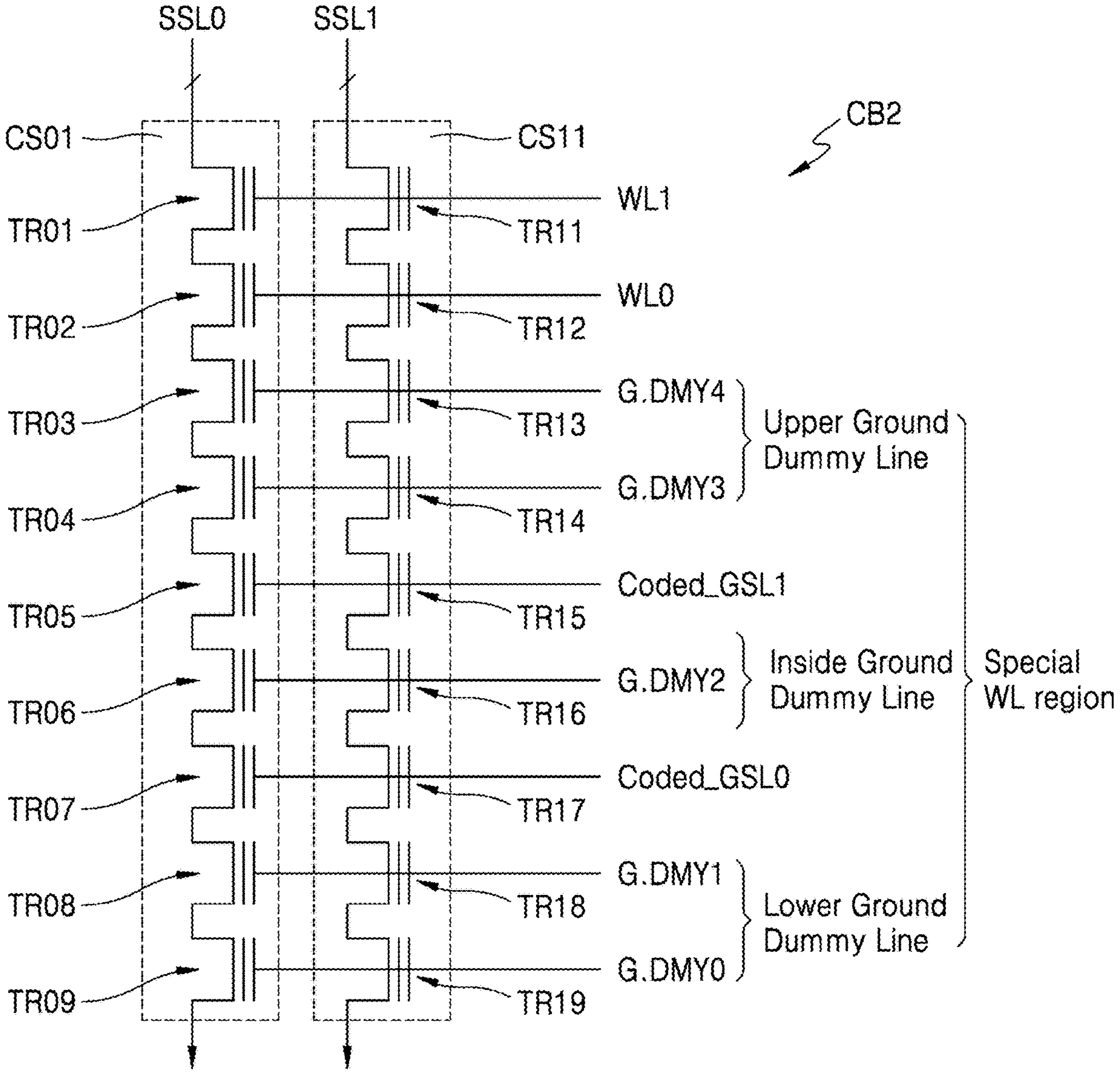
FIGS. 11A to 11C illustrate schematic circuit diagrams of an example cell block included in a memory device according to an embodiment.
Figure 11B:
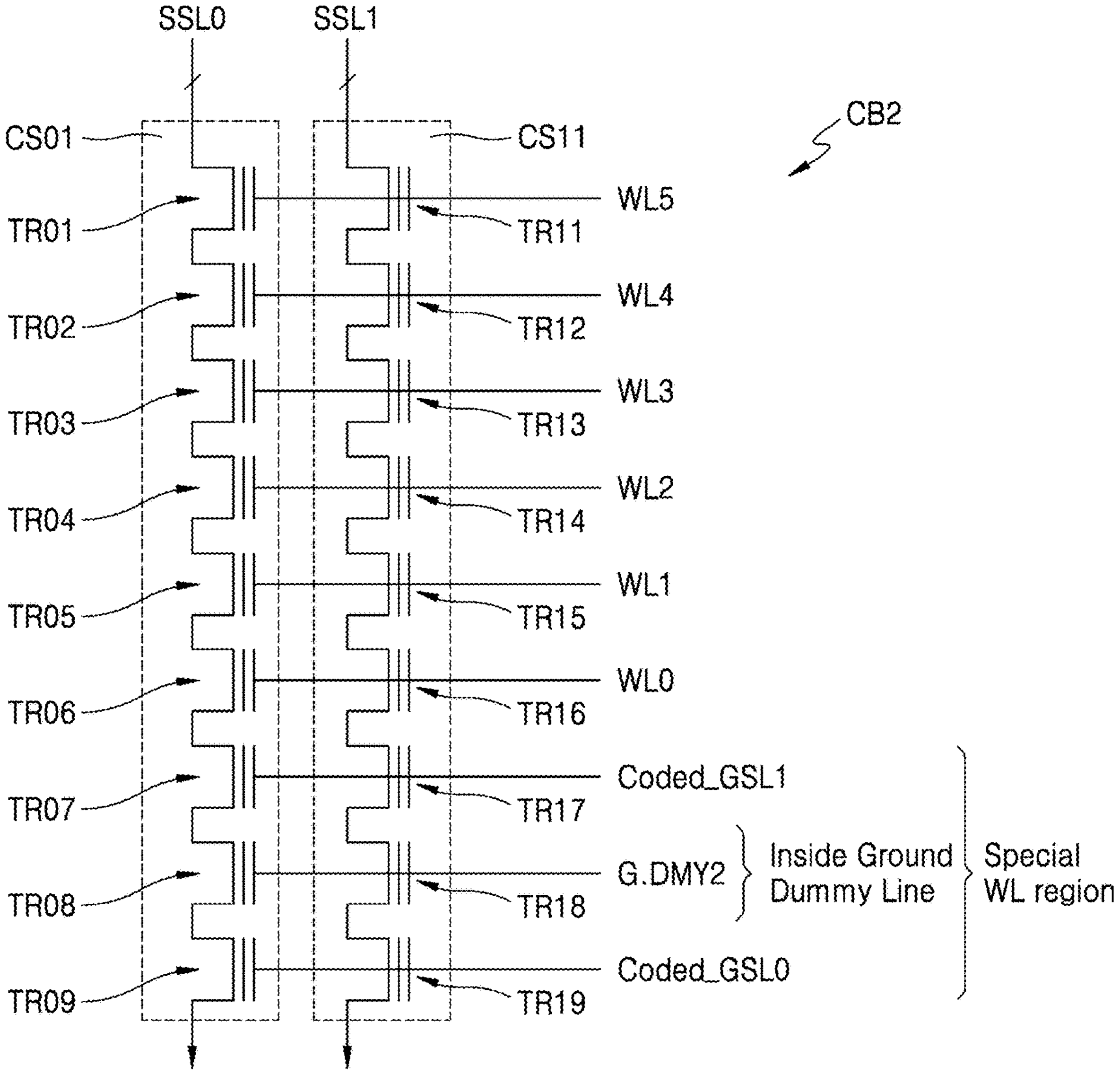
Figure 11C:
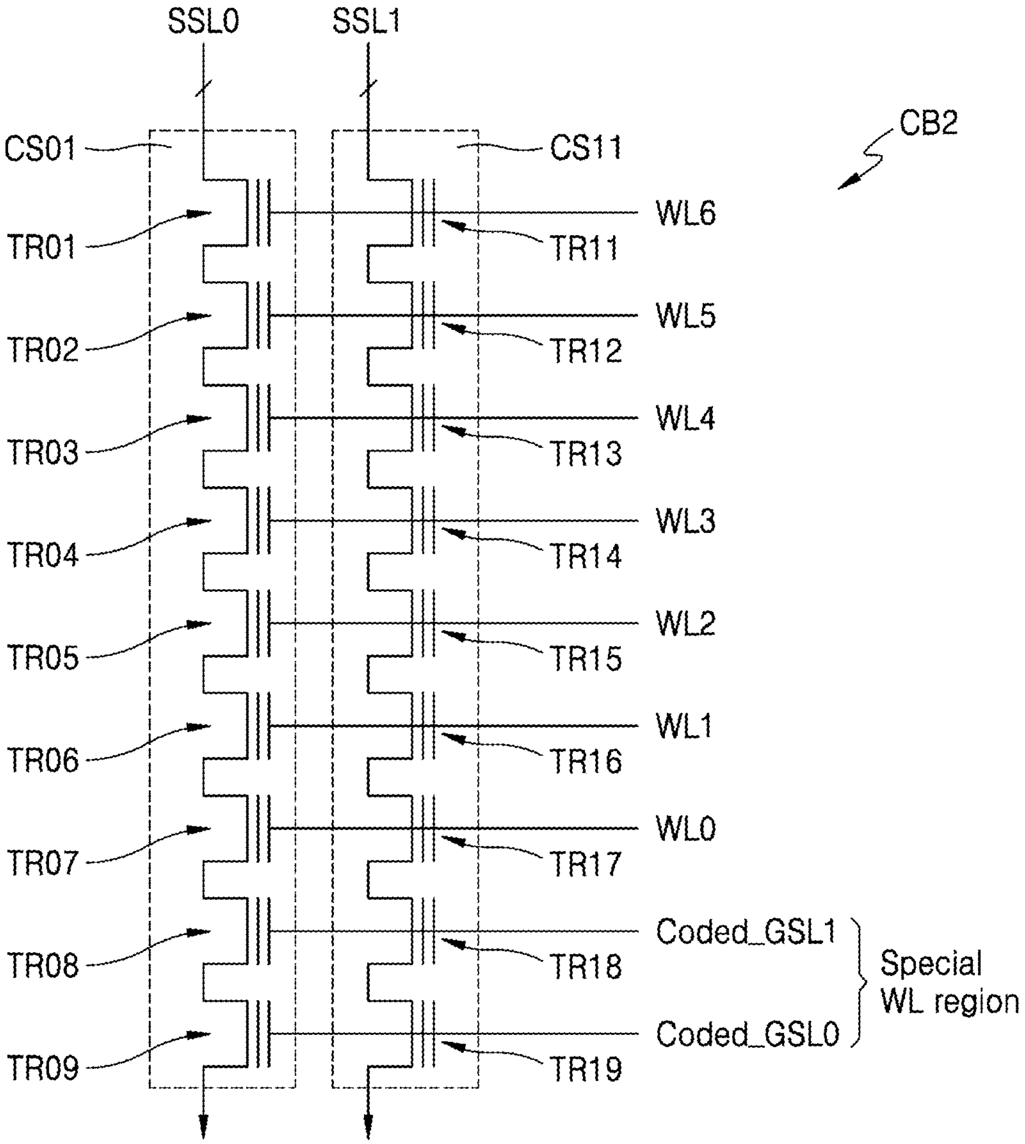

FIGS. 11A to 11C illustrate a cell block included in a memory device according to an embodiment. FIGS. 11A to 11C may be described with reference to FIGS. 1 and 10A to 10C. Repeated descriptions may be omitted. Hereinafter, a second cell block CB2, which is an embodiment, of cell blocks will be described.

The second cell block CB2, unlike the first cell block CB1, may not further include ground selection lines GSLu and GSLd. Also, the second cell block CB2 may not further include the erase control lines GIDL_GS0 and GIDL_GS1. Accordingly, the degree of integration of the memory device 100 may be enhanced.

Figure 12:
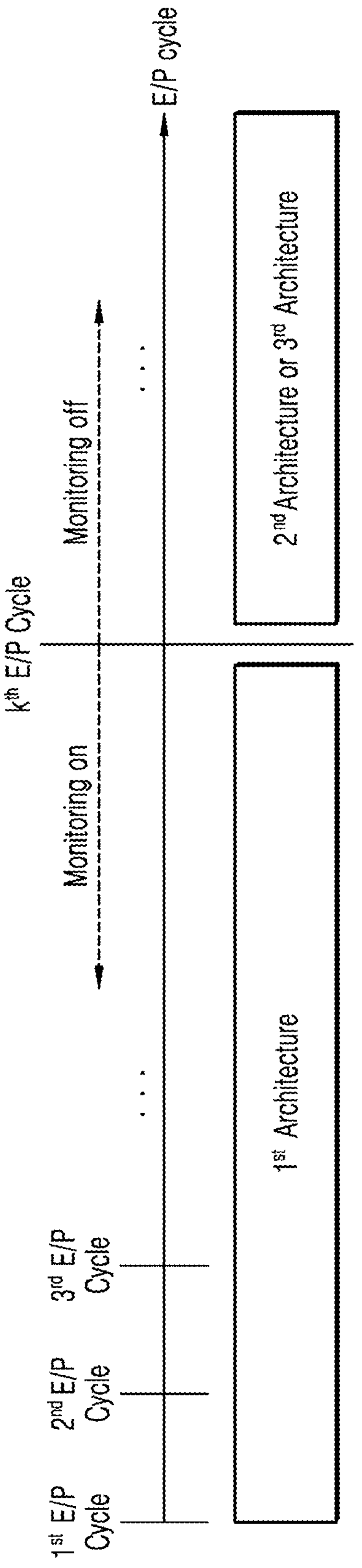
FIGS. 12 to 14 illustrate example operations of a memory device according to an embodiment.
Figure 13:
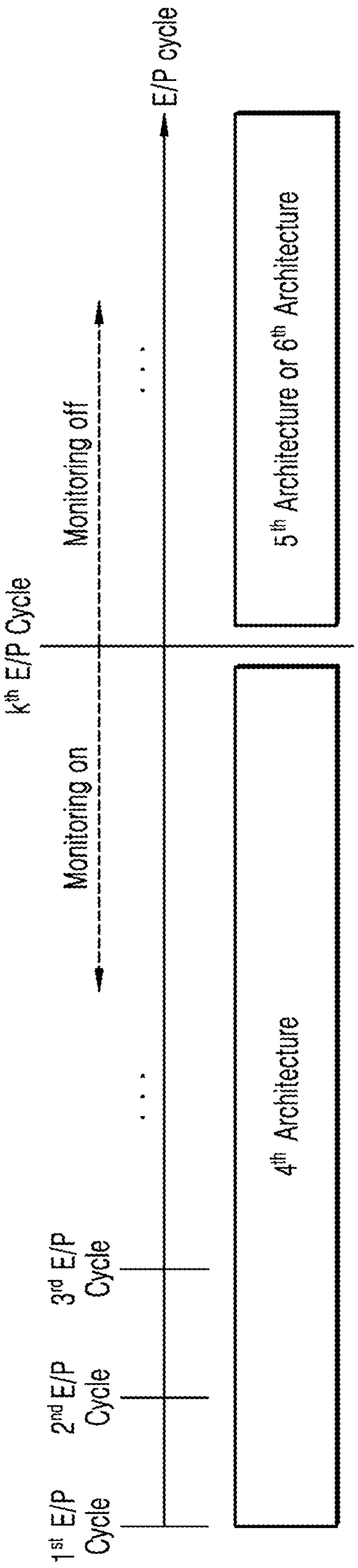
Figure 14:
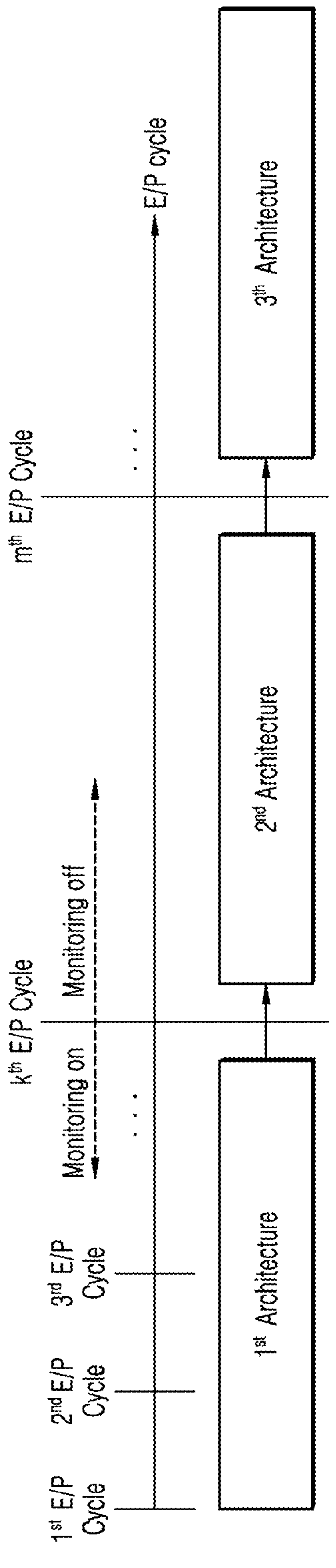

FIGS. 12 to 14 illustrate operations of the memory device 100 of FIG. 1 according to an embodiment. FIGS. 12 to 14 may be described with reference to FIGS. 1, 10A to 10C, and 11A to 11C. FIGS. 12 to 14 may be described based on an embodiment where the certain time point described above with reference to FIG. 1 is the $k^{th}$ E/P cycle, and an embodiment is not limited thereto.

Referring to FIG. 12, the memory device 100 may perform an erase operation and a program operation on transistors connected to a special word line of a first cell block CB1, based on threshold voltage monitoring of the transistors connected to the special word line (i.e., monitoring on) up to a $(k-1)^{th}$ E/P cycle. The first cell block CB1 may have the first architecture up to the $(k-1)^{th}$ E/P cycle.

The memory device 100 may perform an erase operation on some of a plurality of ground selection transistors at every N (where N may be an integer of 1 or more) number of E/P cycles of the first cell block CB1 (i.e., monitoring off) from the $k^{th}$ E/P cycle and may then perform programming with a first threshold voltage. The memory device 100 may program the other ground selection transistors from the $k^{th}$ E/P cycle with a second threshold voltage which is higher than the first threshold voltage. The first cell block CB1 may have the second architecture or the third architecture from the $k^{th}$ E/P cycle.

The memory device 100 may change the use of lines disposed in a special word line region and may thus change the first cell block CB1 from the first architecture to the second architecture or the third architecture. The memory device 100 may increase the number of word lines connected to a transistor which stores data.

Referring to FIG. 13, the memory device 100 may perform an erase operation and a program operation on transistors connected to a special word line of a second cell block CB2, based on threshold voltage monitoring of the transistors connected to the special word line up to the $(k-1)^{th}$ E/P cycle. The first cell block CB1 may have the first architecture up to the $(k-1)^{th}$ E/P cycle. The second cell block CB2 may have a fourth architecture up to the $(k-1)^{th}$ E/P cycle.

The memory device 100 may perform an erase operation on some of a plurality of ground selection transistors at every N (where N may be an integer of 1 or more) number of E/P cycles of the second cell block CB2 from the $k^{th}$ E/P cycle and may then perform programming with a first threshold voltage. The second cell block CB2 may have a fifth architecture or a sixth architecture from the $k^{th}$ E/P cycle.

Referring to FIG. 14, the memory device 100 may perform an erase operation and a program operation on the transistors connected to the special word line of the first cell block CB1, based on threshold voltage monitoring of the transistors connected to the special word line up to the $(k-1)^{th}$ E/P cycle. The first cell block CB1 may have the first architecture up to the $(k-1)^{th}$ E/P cycle.

The memory device 100 may perform an erase operation on some of a plurality of ground selection transistors at every N (where N may be an integer of 1 or more) number of E/P cycles of the first cell block CB1 from the $k^{th}$ E/P cycle and may then perform programming with the first threshold voltage. The memory device 100 may program the other ground selection transistors from the $k^{th}$ E/P cycle with the second threshold voltage which is higher than the first threshold voltage. The first cell block CB1 may have the second architecture up to an $(m-1)^{th}$ E/P cycle from the $k^{th}$ E/P cycle. The first cell block CB1 may have the third architecture from the $m^{th}$ E/P cycle and thereafter.

Figure 15:
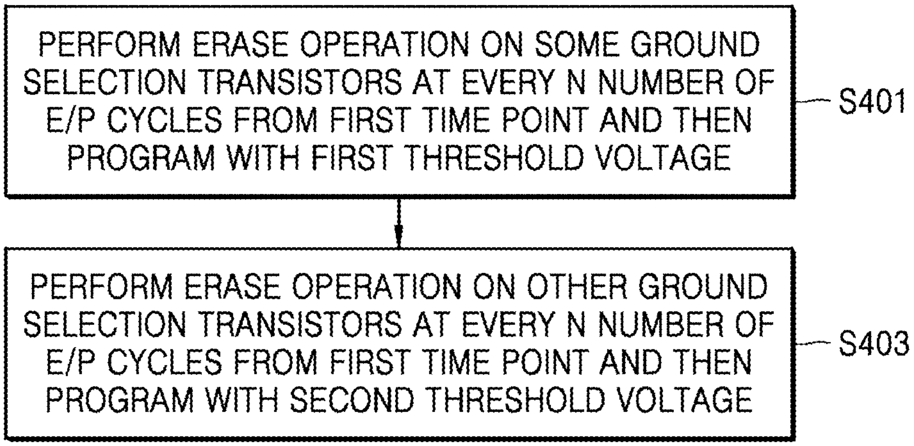
FIG. 15 illustrates an operating method of a memory device according to an embodiment.

FIG. 15 illustrates an operating method of the memory device 100 of FIG. 1 according to an embodiment. FIG. 15 may be described with reference to FIG. 1.

The memory device 100 may perform an erase operation and a program operation on transistors connected to a coded GSL from a first time point (a certain time point), without threshold voltage monitoring.

In detail, referring to FIG. 15, in operation S401, the memory device 100 may perform an erase operation on some of a plurality of ground selection transistors at every N (where N may be an integer of 1 or more) number of E/P cycles from the first time point and may then perform a program operation with the first threshold voltage. In operation S403, the memory device 100 may perform an erase operation on the other ground selection transistors at every N number of E/P cycles from the first time point and may then perform a program operation with the second threshold voltage. Furthermore, according to an embodiment, the first time point may differ per a plurality of ground selection transistors. According to an embodiment, N may differ per a plurality of string selection transistors.

Figure 16:
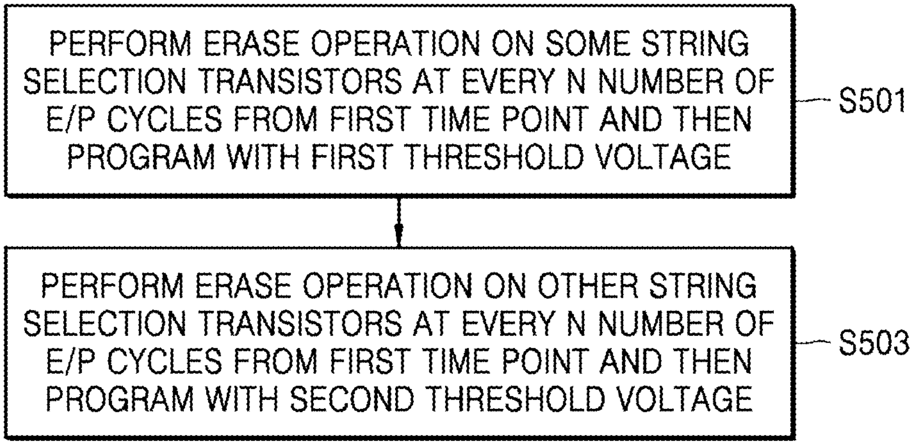
FIG. 16 illustrates an operating method of a memory device according to an embodiment.

FIG. 16 illustrates an operating method of the memory device 100 of FIG. 1 according to an embodiment. FIG. 16 may be described with reference to FIG. 1.

Embodiments of a coded GSL have been described in FIGS. 2 and 3, but are not limited thereto and the operating method of the memory device according to an embodiment may be applied to a coded SSL. The memory device 100 may perform an erase operation and a program operation on transistors connected to the coded SSL from a first time point, without threshold voltage monitoring.

Referring to FIG. 16, in operation S501, the memory device 100 may perform an erase operation on some of a plurality of string selection transistors at every N number of E/P cycles from the first time point and may then perform programming with the first threshold voltage. Here, N may be a positive integer.

In operation S503, the memory device 100 may perform an erase operation on the other string selection transistors at every N number of E/P cycles from the first time point and may then perform programming with the second threshold voltage. Furthermore, according to an embodiment, the first time point may differ in a plurality of ground selection transistors. According to an embodiment, N may differ per a plurality of string selection transistors.

Figure 17:
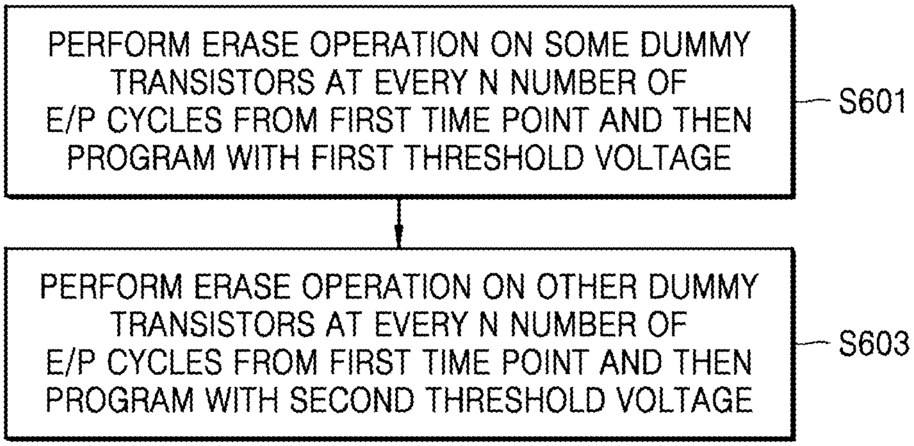
FIG. 17 illustrates an operating method of a memory device according to an embodiment.

FIG. 17 illustrates an operating method of the memory device 100 of FIG. 1 according to an embodiment. FIG. 17 may be described with reference to FIG. 1.

The memory device 100 may perform an erase operation and a program operation on transistors connected to a coded dummy word line (a special dummy word line) from a first time point, without threshold voltage monitoring.

Referring to FIG. 17, in operation S601, the memory device 100 may perform an erase operation on some of a plurality of dummy transistors at every N number of E/P cycles from the first time point and may then perform programming with the first threshold voltage. Here, N may be a positive integer.

In operation S603, the memory device 100 may perform an erase operation on the other dummy transistors at every N number of E/P cycles from the first time point and may then perform programming with the second threshold voltage. Furthermore, according to an embodiment, the first time point may differ in a plurality of dummy transistors. According to an embodiment, N may differ per a plurality of dummy transistors.

Figure 18:
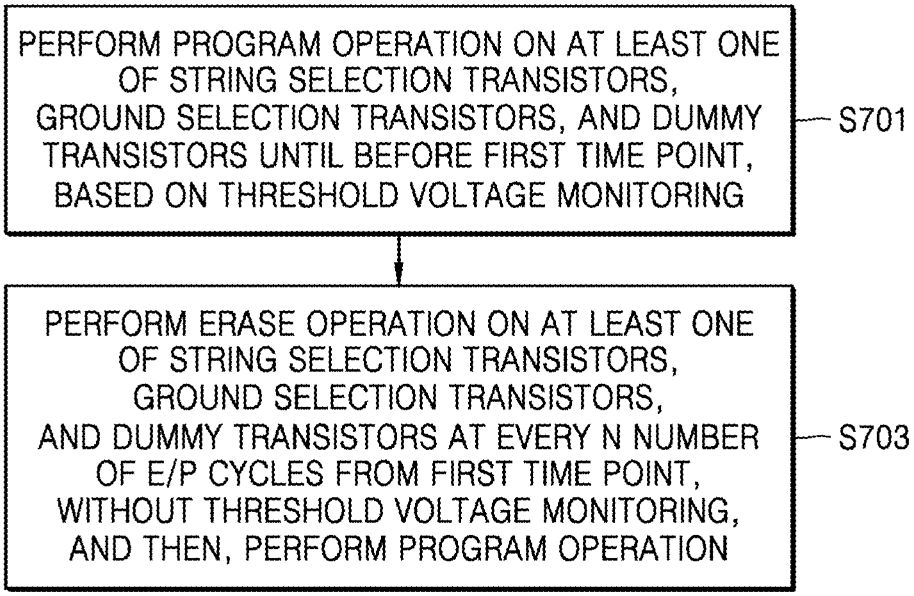
FIG. 18 illustrates an operating method of a memory device according to an embodiment.

FIG. 18 illustrates an operating method of the memory device 100 of FIG. 1 according to an embodiment. FIG. 18 may be described with reference to FIG. 1.

The memory device 100 may perform an erase operation and a program operation on transistors connected to word lines except a word line for user data without threshold voltage monitoring. Hereinafter, the operating method of a memory device according to an embodiment will be described.

Referring to FIG. 18, in operation S701, the memory device 100 may perform a program operation on at least one of string selection transistors, ground selection transistors, and dummy transistors until before a first time point, based on threshold voltage monitoring.

In operation S703, the memory device 100 may perform an erase operation on at least one of the string selection transistors, the ground selection transistors, and the dummy transistors at every N number of E/P cycles from the first time point, without threshold voltage monitoring, and may then perform programming. Here, N may be a positive integer.

Furthermore, according to an embodiment, first time points of the string selection transistor, the ground selection transistor, and the dummy transistor may differ. According to an embodiment, when a plurality of transistors having the same type are in a cell block, first time points of transistors may differ. According to an embodiment, N may differ per transistors.

Figure 19:
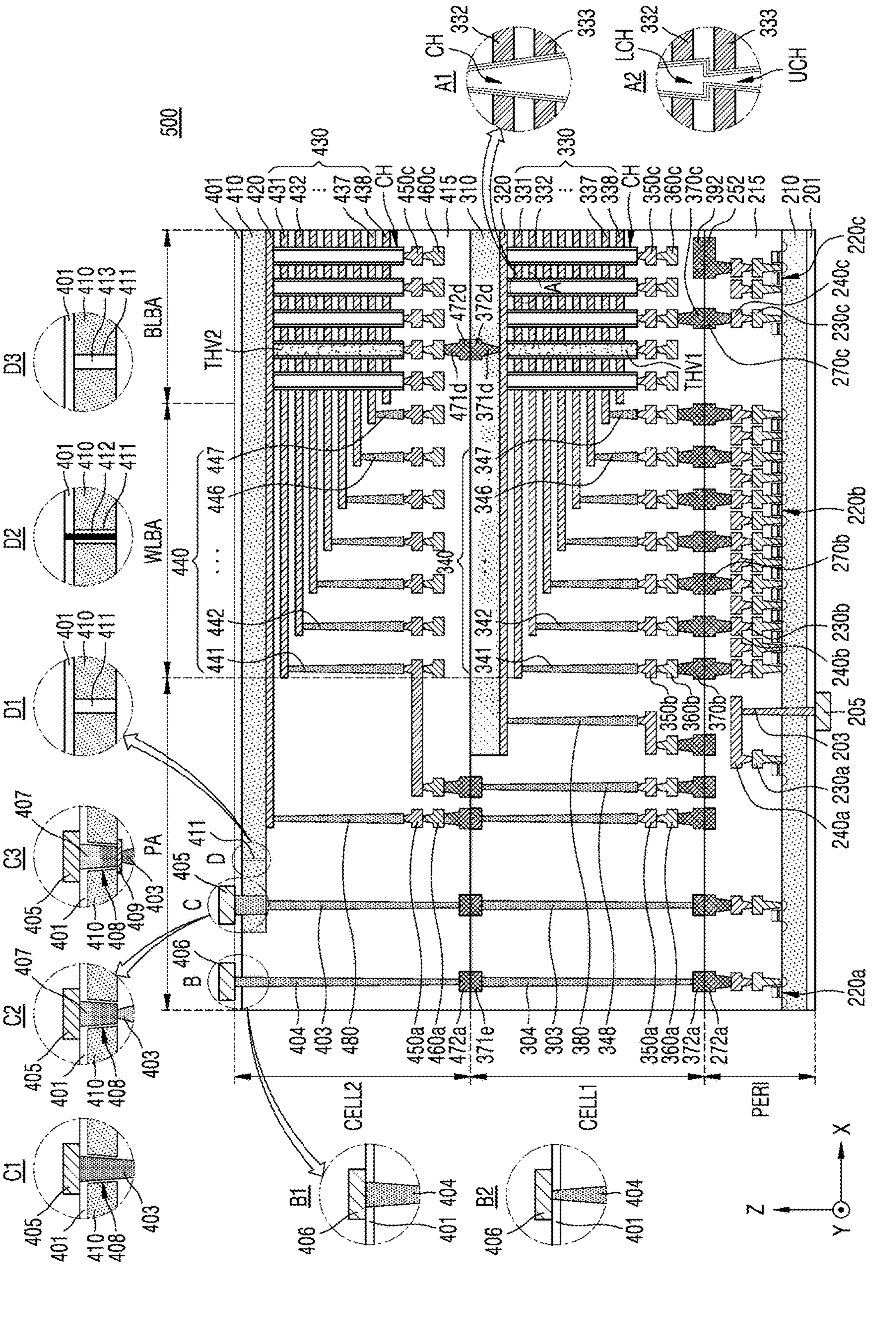
FIG. 19 is a schematic cross-sectional view illustrating a memory device having a B-VNAND structure, according to an embodiment.

FIG. 19 is a schematic cross-sectional view illustrating a memory device 500 having a B-VNAND structure, according to an embodiment.

Referring to FIG. 19, the memory device 500 may have a chip-to-chip (C2C) structure. At least one upper chip including a cell region and a lower chip including a peripheral circuit region PERI may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W).

The memory device 500 may include the at least one upper chip including the cell region. For example, as illustrated in FIG. 19, the memory device 500 may include two upper chips. However, the number of the upper chips is not limited thereto. In the case in which the memory device 500 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other by the bonding method to manufacture the memory device 500. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 19. However, embodiments of the inventive concepts are not limited thereto. In certain embodiments, one of the first upper chip and the second upper chip may be turned over and then may be connected to a corresponding chip by the bonding method.

Each of the peripheral circuit region PERI and the first and second cell regions CELL1 and CELL2 of the memory device 500 may include an external pad bonding region PA, a word line bonding region WLBA, and a bit line bonding region BLBA.

The peripheral circuit region PERI may include a first substrate 210 and a plurality of circuit elements 220*a*, 220*b* and 220*c* formed on the first substrate 210. An interlayer insulating layer 215 including one or more insulating layers may be provided on the plurality of circuit elements 220*a*, 220*b* and 220*c*, and a plurality of metal lines electrically connected to the plurality of circuit elements 220*a*, 220*b* and 220*c* may be provided in the interlayer insulating layer 215. For example, the plurality of metal lines may include first metal lines 230*a*, 230*b* and 230*c* connected to the plurality of circuit elements 220*a*, 220*b* and 220*c*, and second metal lines 240*a*, 240*b* and 240*c* formed on the first metal lines 230*a*, 230*b* and 230*c*. The plurality of metal lines may be formed of at least one of various conductive materials. For example, the first metal lines 230*a*, 230*b* and 230*c* may be formed of tungsten having a relatively high electrical resistivity, and the second metal lines 240*a*, 240*b* and 240*c* may be formed of copper having a relatively low electrical resistivity.

The first metal lines 230*a*, 230*b* and 230*c* and the second metal lines 240*a*, 240*b* and 240*c* are illustrated and described in the present embodiments. However, embodiments of the inventive concepts are not limited thereto. In certain embodiments, at least one or more additional metal lines may further be formed on the second metal lines 240*a*, 240*b* and 240*c*. In this case, the second metal lines 240*a*, 240*b* and 240*c* may be formed of aluminum, and at least some of the additional metal lines formed on the second metal lines 240*a*, 240*b* and 240*c* may be formed of copper having an electrical resistivity lower than that of aluminum of the second metal lines 240*a*, 240*b* and 240*c*.

The interlayer insulating layer 215 may be disposed on the first substrate 210 and may include an insulating material such as silicon oxide and/or silicon nitride.

Each of the first and second cell regions CELL1 and CELL2 may include at least one memory block. The first cell region CELL1 may include a second substrate 310 and a common source line 320. A plurality of word lines 330 (331 to 338) may be stacked on the second substrate 310 in a direction (i.e., the Z-axis direction) perpendicular to a top surface of the second substrate 310. String selection lines and a ground selection line may be disposed on and under the word lines 330, and the plurality of word lines 330 may be disposed between the string selection lines and the ground selection line. Likewise, the second cell region CELL2 may include a third substrate 410 and a common source line 420, and a plurality of word lines 430 (431 to 438) may be stacked on the third substrate 410 in a direction (i.e., the Z-axis direction) perpendicular to a top surface of the third substrate 410. Each of the second substrate 310 and the third substrate 410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CELL1 and CELL2.

In some embodiments, as illustrated in a region 'A1', the channel structure CH may be provided in the bit line bonding region BLBA and may extend in the direction perpendicular to the top surface of the second substrate 310 to penetrate (i.e., extend in or through) the word lines 330, the string selection lines, and the ground selection line. The channel structure CH may include a data storage layer, a channel layer, and a filling insulation layer. The channel layer may be electrically connected to a first metal line 350*c* and a second metal line 360*c* in the bit line bonding region BLBA. For example, the second metal line 360*c* may be a bit line and may be connected to the channel structure CH through the first metal line 350*c*. The bit line 360*c* may extend in a first direction (e.g., a Y-axis direction) parallel to the top surface of the second substrate 310.

In some embodiments, as illustrated in a region 'A2', which may be an alternative configuration of the channel structure CH shown in region 'A1', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 310 to penetrate the common source line 320 and lower word lines 331 and 332. The lower channel LCH may include a data storage layer, a channel layer, and a filling insulation layer and may be connected to the upper channel UCH. The upper channel UCH may penetrate upper word lines 333 to 338. The upper channel UCH may include a data storage layer, a channel layer, and a filling insulation layer, and the channel layer of the upper channel UCH may be electrically connected to the first metal line 350*c* and the second metal line 360*c*. As a length of a channel increases, due to characteristics of manufacturing processes, it may be difficult to form a channel having a substantially uniform width. The memory device 500 according to the present embodiments may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A2', a word line located near to a boundary between the lower channel LCH and the upper channel UCH may be a dummy word line. For example, the word lines 332 and 333 adjacent to the boundary between the lower channel LCH and the upper channel UCH may be the dummy word lines. In this case, data may not be stored in memory cells connected to the dummy word line. Alternatively, the number of pages corresponding to the memory cells connected to the dummy word line may be less than the number of pages corresponding to the memory cells connected to a general word line. A level of a voltage applied to the dummy word line may be different from a level of a voltage applied to the general word line, and thus it is possible to reduce an influence of a non-uniform channel width between the lower and upper channels LCH and UCH on an operation of the memory device.

Meanwhile, the number of the lower word lines 331 and 332 penetrated by the lower channel LCH is less than the number of the upper word lines 333 to 338 penetrated by the upper channel UCH in the region 'A2'. However, embodiments of the inventive concepts are not limited thereto. In certain embodiments, the number of the lower word lines penetrated by the lower channel LCH may be equal to or more than the number of the upper word lines penetrated by the upper channel UCH. In addition, structural features and connection relation of the channel structure CH disposed in the second cell region CELL2 may be substantially the same as those of the channel structure CH disposed in the first cell region CELL1.

In the bit line bonding region BLBA, a first through-electrode THV1 may be provided in the first cell region CELL1, and a second through-electrode THV2 may be provided in the second cell region CELL2. In certain embodiments, the first through-electrode THV1 may further penetrate the second substrate 310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some embodiments, the first through-electrode THV1 and the second through-electrode THV2 may be electrically connected to each other through a first through-metal pattern 372*d* and a second through-metal pattern 472*d*. The first through-metal pattern 372*d* may be formed at a bottom end of the first upper chip including the first cell region CELL1, and the second through-metal pattern 472*d* may be formed at a top end of the second upper chip including the second cell region CELL2. The first through-electrode THV1 may be electrically connected to the first metal line 350*c* and the second metal line 360*c*. A lower via 371*d* may be formed between the first through-electrode THV1 and the first through-metal pattern 372*d*, and an upper via 471*d* may be formed between the second through-electrode THV2 and the second through-metal pattern 472*d*. The first through-metal pattern 372*d* and the second through-metal pattern 472*d* may be connected to each other by the bonding method.

In addition, in the bit line bonding region BLBA, an upper metal pattern 252 may be formed in an uppermost metal layer of the peripheral circuit region PERI, and an upper metal pattern 392 having the same shape as the upper metal pattern 252 may be formed in an uppermost metal layer of the first cell region CELL1. The upper metal pattern 392 of the first cell region CELL1 and the upper metal pattern 252 of the peripheral circuit region PERI may be electrically connected to each other by the bonding method. In the bit line bonding region BLBA, the bit line 360*c* may be electrically connected to a page buffer included in the peripheral circuit region PERI. For example, some of the circuit elements 220*c* of the peripheral circuit region PERI may constitute the page buffer, and the bit line 360*c* may be electrically connected to the circuit elements 220*c* constituting the page buffer through an upper bonding metal pattern 370*c* of the first cell region CELL1 and an upper bonding metal pattern 270*c* of the peripheral circuit region PERI.

Referring continuously to FIG. 19, in the word line bonding region WLBA, the word lines 330 of the first cell region CELL1 may extend in a second direction (e.g., an X-axis direction) parallel to the top surface of the second substrate 310 and may be connected to a plurality of cell contact plugs 340 (341 to 347). First metal lines 350*b* and second metal lines 360*b* may be sequentially connected onto the cell contact plugs 340 connected to the word lines 330. In the word line bonding region WLBA, the cell contact plugs 340 may be connected to the peripheral circuit region PERI through upper bonding metal patterns 370*b* of the first cell region CELL1 and upper bonding metal patterns 270*b* of the peripheral circuit region PERI.

The cell contact plugs 340 may be electrically connected to a row decoder included in the peripheral circuit region PERI. For example, some of the circuit elements 220*b* of the peripheral circuit region PERI may constitute the row decoder, and the cell contact plugs 340 may be electrically connected to the circuit elements 220*b* constituting the row decoder through the upper bonding metal patterns 370*b* of the first cell region CELL1 and the upper bonding metal patterns 270*b* of the peripheral circuit region PERI. In some embodiments, an operating voltage of the circuit elements 220*b* constituting the row decoder may be different from an operating voltage of the circuit elements 220*c* constituting the page buffer. For example, the operating voltage of the circuit elements 220*c* constituting the page buffer may be greater than the operating voltage of the circuit elements 220*b* constituting the row decoder.

Likewise, in the word line bonding region WLBA, the word lines 430 of the second cell region CELL2 may extend in the second direction (e.g., the X-axis direction) parallel to the top surface of the third substrate 410 and may be connected to a plurality of cell contact plugs 440 (441 to 447). The cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 370*b* may be formed in the first cell region CELL1, and the upper bonding metal patterns 270*b* may be formed in the peripheral circuit region PERI. The upper bonding metal patterns 370*b* of the first cell region CELL1 and the upper bonding metal patterns 270*b* of the peripheral circuit region PERI may be electrically connected to each other by the bonding method. The upper bonding metal patterns 370*b* and the upper bonding metal patterns 270*b* may be formed of aluminum, copper, or tungsten.

In the external pad bonding region PA, a lower metal pattern 371*e* may be formed in a lower portion of the first cell region CELL1, and an upper metal pattern 472*a* may be formed in an upper portion of the second cell region CELL2. The lower metal pattern 371*e* of the first cell region CELL1 and the upper metal pattern 472*a* of the second cell region CELL2 may be electrically connected to each other by the bonding method in the external pad bonding region PA. Likewise, an upper metal pattern 372*a* may be formed in an upper portion of the first cell region CELL1, and an upper metal pattern 272*a* may be formed in an upper portion of the peripheral circuit region PERI. The upper metal pattern 372*a* of the first cell region CELL1 and the upper metal pattern 272*a* of the peripheral circuit region PERI may be electrically connected to each other by the bonding method.

Common source line contact plugs 380 and 480 may be disposed in the external pad bonding region PA. The common source line contact plugs 380 and 480 may be formed of a conductive material such as a metal, a metal compound, and/or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350*a* and a second metal line 360*a* may be sequentially stacked on the common source line contact plug 380 of the first cell region CELL1, and a first metal line 450*a* and a second metal line 460*a* may be sequentially stacked on the common source line contact plug 480 of the second cell region CELL2.

Input/output pads 205, 405 and 406 may be disposed in the external pad bonding region PA. Referring to FIG. 19, a lower insulating layer 201 may cover a bottom surface of the first substrate 210, and a first input/output pad 205 may be formed on the lower insulating layer 201. The term "cover" (or "covering," "covers," or like terms), as may be used herein, is intended to broadly refer to an element, structure or layer that is on or over another element, structure or layer, either directly or with one or more other intervening elements, structures or layers therebetween. The first input/output pad 205 may be connected to at least one of a plurality of the circuit elements 220*a* disposed in the peripheral circuit region PERI through a first input/output contact plug 203 and may be separated from the first substrate 210 by the lower insulating layer 201. In addition, a side insulating layer (not explicitly shown, but implied) may be disposed between the first input/output contact plug 203 and the first substrate 210 to electrically isolate the first input/output contact plug 203 from the first substrate 210.

An upper insulating layer 401 covering a top surface of the third substrate 410 may be formed on the third substrate 410. A second input/output pad 405 and/or a third input/output pad 406 may be disposed on the upper insulating layer 401. The second input/output pad 405 may be connected to at least one of the plurality of circuit elements 220*a* disposed in the peripheral circuit region PERI through second input/output contact plugs 403 and 303, and the third input/output pad 406 may be connected to at least one of the plurality of circuit elements 220*a* disposed in the peripheral circuit region PERI through third input/output contact plugs 404 and 304.

In some embodiments, the third substrate 410 may not be disposed in a region in which the input/output contact plug is disposed. For example, as illustrated in a region 'B', the third input/output contact plug 404 may be separated from the third substrate 410 in a direction parallel to the top surface of the third substrate 410 and may penetrate an interlayer insulating layer 415 of the second cell region CELL2 and the upper insulating layer 401 so as to be connected to the third input/output pad 406. In this case, the third input/output contact plug 404 may be formed by at least one of various processes.

In some embodiments, as illustrated in a region 'B1', the third input/output contact plug 404 may extend in a third direction (e.g., the Z-axis direction), and a diameter of the third input/output contact plug 404 may become progressively greater toward the upper insulating layer 401. In other words, a diameter of the channel structure CH described in the region 'A1' may become progressively less toward the upper insulating layer 401, but the diameter of the third input/output contact plug 404 may become progressively greater toward the upper insulating layer 401. For example, the third input/output contact plug 404 may be formed after the second cell region CELL2 and the first cell region CELL1 are bonded to each other by the bonding method.

In certain embodiments, as illustrated in a region 'B2', the third input/output contact plug 404 may extend in the third direction (e.g., the Z-axis direction), and a diameter of the third input/output contact plug 404 may become progressively less toward the upper insulating layer 401. In other words, like the channel structure CH, the diameter of the third input/output contact plug 404 may become progressively less toward the upper insulating layer 401. For example, the third input/output contact plug 404 may be formed together with the cell contact plugs 440 before the second cell region CELL2 and the first cell region CELL1 are bonded to each other.

In certain embodiments, the input/output contact plug may overlap with the third substrate 410. For example, as illustrated in a region 'C', the second input/output contact plug 403 may penetrate the interlayer insulating layer 415 of the second cell region CELL2 in the third direction (e.g., the Z-axis direction) and may be electrically connected to the second input/output pad 405 through the third substrate 410. In this case, a connection structure of the second input/output contact plug 403 and the second input/output pad 405 may be realized by various methods. The term "overlap" (or "overlapping," or like terms), as may be used herein, is intended to broadly refer to a first element that intersects with at least a portion of a second element in the vertical direction (i.e., Z-axis direction in FIG. 19), but does not require that the first and second elements be completely aligned with one another in a horizontal plane (i.e., in the X-axis direction and/or the Y-axis direction).

In some embodiments, as illustrated in a region 'C1', an opening 408 may be formed to penetrate the third substrate 410 and the upper insulating layer 401, and the second input/output contact plug 403 may be connected directly to the second input/output pad 405 through the opening 408 formed in the third substrate 410 and upper insulating layer 401. In this case, as illustrated in the region 'C1', a diameter of the second input/output contact plug 403 may become progressively greater toward the second input/output pad 405. However, embodiments of the inventive concepts are not limited thereto, and in certain embodiments, the diameter of the second input/output contact plug 403 may become progressively less toward the second input/output pad 405.

In certain embodiments, as illustrated in a region 'C2', the opening 408 penetrating the third substrate 410 and the upper insulating layer 401 may be formed, and a contact 407 may be formed in the opening 408. An end of the contact 407 may be connected to the second input/output pad 405, and another end of the contact 407 may be connected to the second input/output contact plug 403. Thus, the second input/output contact plug 403 may be electrically connected to the second input/output pad 405 through the contact 407 in the opening 408. In this case, as illustrated in the region 'C2', a diameter of the contact 407 may become progressively greater toward the second input/output pad 405, and a diameter of the second input/output contact plug 403 may become progressively less toward the second input/output pad 405. For example, the second input/output contact plug 403 may be formed together with the cell contact plugs 440 before the second cell region CELL2 and the first cell region CELL1 are bonded to each other, and the contact 407 may be formed after the second cell region CELL2 and the first cell region CELL1 are bonded to each other.

In certain embodiments illustrated in a region 'C3', a stopper 409 may further be formed on a bottom end of the opening 408 of the third substrate 410, as compared with the embodiments of the region 'C2'. The stopper 409 may be a metal line formed in the same layer as the common source line 420. Alternatively, the stopper 409 may be a metal line formed in the same layer as at least one of the word lines 430. The second input/output contact plug 403 may be electrically connected to the second input/output pad 405 through the contact 407 and the stopper 409.

Like the second and third input/output contact plugs 403 and 404 of the second cell region CELL2, a diameter of each of the second and third input/output contact plugs 303 and 304 of the first cell region CELL1 may become progressively less toward the lower metal pattern 371*e* or may become progressively greater toward the lower metal pattern 371*e*.

Meanwhile, in some embodiments, a slit 411 may be formed in the third substrate 410. For example, the slit 411 may be formed at a certain position of the external pad bonding region PA. For example, as illustrated in a region 'D', the slit 411 may be located between the second input/output pad 405 and the cell contact plugs 440 when viewed in a plan view. Alternatively, the second input/output pad 405 may be located between the slit 411 and the cell contact plugs 440 when viewed in a plan view.

In some embodiments, as illustrated in a region 'D1', the slit 411 may be formed to penetrate the third substrate 410. For example, the slit 411 may be used to prevent the third substrate 410 from being finely cracked when the opening 408 is formed. However, embodiments of the inventive concepts are not limited thereto, and in certain embodiments, the slit 411 may be formed to have a depth ranging from about 60% to about 70% of a thickness of the third substrate 410, although embodiments are not limited thereto.

In certain embodiments, as illustrated in a region 'D2', a conductive material 412 may be formed in the slit 411. For example, the conductive material 412 may be used to discharge a leakage current occurring in driving of the circuit elements in the external pad bonding region PA to the outside. In this case, the conductive material 412 may be connected to an external ground line.

In certain embodiments, as illustrated in a region 'D3', an insulating material 413 may be formed in the slit 411. For example, the insulating material 413 may be used to electrically isolate the second input/output pad 405 and the second input/output contact plug 403 disposed in the external pad bonding region PA from the word line bonding region WLBA. Since the insulating material 413 is formed in the slit 411, it is possible to prevent a voltage provided through the second input/output pad 405 from affecting a metal layer disposed on the third substrate 410 in the word line bonding region WLBA.

Meanwhile, in certain embodiments, the first to third input/output pads 205, 405 and 406 may be selectively formed. For example, the memory device 500 may be realized to include only the first input/output pad 205 disposed on the first substrate 210, to include only the second input/output pad 405 disposed on the third substrate 410, or to include only the third input/output pad 406 disposed on the upper insulating layer 401.

In some embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer covering a top surface of the common source line 320 or a conductive layer for connection may be formed. Likewise, the third substrate 410 of the second cell region CELL2 may be removed before or after the bonding process of the first cell region CELL1 and the second cell region CELL2, and then, the upper insulating layer 401 covering a top surface of the common source line 420 or a conductive layer for connection may be formed.

Figure 20:
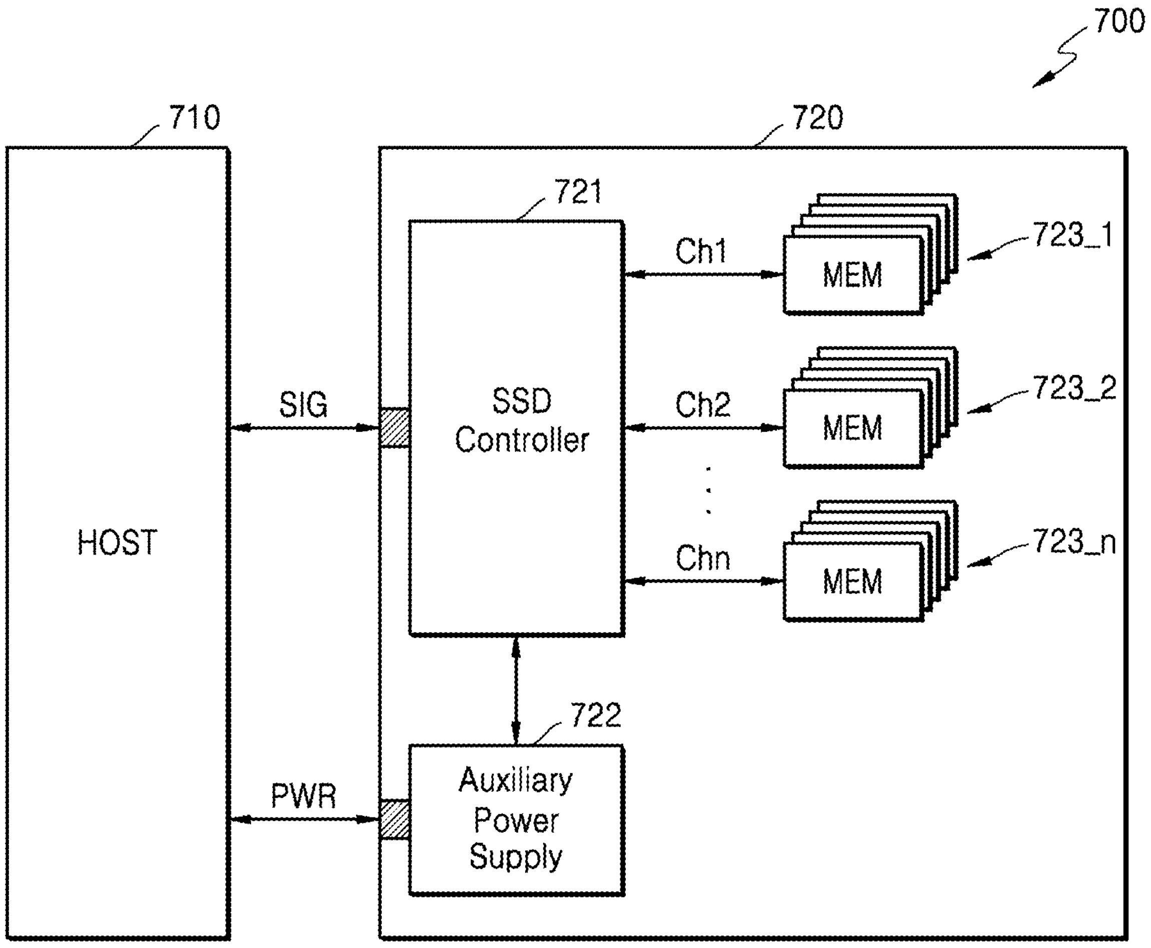
FIG. 20 is a block diagram illustrating an example where a memory device according to an embodiment is applied to a solid-state drive (SSD) system.

FIG. 20 is a block diagram illustrating an example where a memory device according to an embodiment is applied to an SSD system 700.

Referring to FIG. 20, the SSD system 700 may include a host 710 and an SSD 720. The SSD 720 may transmit and receive a signal to and from the host 710 through a signal connector (SIG) and may be supplied with power through a power connector (PWR). The SSD 720 may include an SSD controller 721, an auxiliary power supply 722, and memory devices 723_1 to 723_*n*, where n is a positive integer. The memory device 723_1 to 723_*n* may be a vertical stack-type NAND flash memory device. In this case, the SSD 720 may be implemented by using the embodiments described above with reference to FIGS. 1 to 15. That is, each of the memory devices 723_1 to 723_*n* included in the SSD 720 may include a plurality of cell blocks. Also, the cell blocks may have one of the structures illustrated in FIGS. 10A to 10C and 11A to 11C. Also, GSL region coding may be performed based on the method illustrated in FIGS. 1 to 15. The memory devices 723_1 to 723_*n* may communicate with the SSD controller 721 via corresponding channels Ch1 to Chn established between the SSD controller 721 and the respective memory devices 723_1 to 723_*n*.

Hereinabove, exemplary embodiments have been described in the drawings and the specification. Embodiments have been described by using the terms described herein, but this has been merely used for describing the inventive concept and has not been used for limiting a meaning or limiting the scope of the inventive concept defined in the following claims. Therefore, it may be understood by those of ordinary skill in the art that various modifications and other equivalent embodiments may be implemented from the inventive concept. Accordingly, the spirit and scope of the inventive concept may be defined based on the spirit and scope of the following claims.

While the inventive concept has been particularly shown and described with reference to embodiments thereof, it will be understood that various changes in form and details may be made therein without departing from the spirit and scope of the following claims.

What is claimed is:

1. A memory device, comprising:

a memory cell array including a plurality of cell blocks, each of the plurality of cell blocks including a plurality of cell strings connected in parallel between a bit line and a common source line; and a control logic configured to control a program operation, a read operation, and an erase operation on the memory cell array, wherein at least one of the plurality of cell blocks comprises a plurality of ground selection transistors connected to a corresponding plurality of special word lines, a first subset of the plurality of ground selection transistors are programmed to a first threshold voltage, and a second subset of the plurality of ground selection transistors are programmed to a second threshold voltage which is greater than the first threshold voltage, and the control logic is further configured to perform an erase operation on the first subset of the plurality of ground selection transistors at every N (where N is an integer of 1 or more) number of erase/program (E/P) cycles from a first time point and then program the first subset of the plurality of ground selection transistors to the first threshold voltage, and to perform an erase operation on the second subset of the plurality of ground selection transistors from the first time point and then program the second subset of the plurality of ground selection transistors to the second threshold voltage.

2. The memory device of claim 1, wherein the first time point is a $k^{th}$ (where k is a positive integer) E/P cycle.

3. The memory device of claim 1, wherein N is 1.

4. The memory device of claim 1, wherein the control logic is further configured, based on monitoring threshold voltages of the plurality of ground selection transistors, to perform an erase operation on the first subset of the plurality of ground selection transistors until before the first time point and then program the first subset of the plurality of ground selection transistors to the first threshold voltage until before the first time point, and to perform an erase operation on the second subset of the plurality of ground selection transistors and then program the second subset of the plurality of ground selection transistors to the second threshold voltage until before the first time point.

5. The memory device of claim 4, wherein the first time point is after an $m^{th}$ (where m is a positive integer) program fail is confirmed on at least one of the first threshold voltage of the first subset of the plurality of ground selection transistors and the second threshold voltage of the second subset of the plurality of ground selection transistors based on a monitoring result of the control logic.

6. The memory device of claim 1, wherein the first time point is determined based on a predetermined number of program loops.

7. The memory device of claim 1, wherein the first time point is after exceeding a predetermined number of read operations on the plurality of cell blocks.

8. The memory device of claim 1, wherein the first time point is after a predetermined use time of the memory device elapses.

9. The memory device of claim 1, wherein the control logic is further configured to, when programming of at least one of the first threshold voltage of the first subset of the plurality of ground selection transistors and the second threshold voltage of the second subset of the plurality of ground selection transistors fails, perform an erase operation on the first subset of the plurality of ground selection transistors at every N number of E/P cycles and then program the first subset of the plurality of ground selection transistors to the first threshold voltage, and to perform an erase operation on the second subset of the plurality of ground selection transistors and then program the second subset of the plurality of ground selection transistors to the second threshold voltage.

10. The memory device of claim 1, wherein the plurality of cell blocks comprise a first cell block and a second cell block, a memory cell level of the first cell block is higher than a memory cell level of the second cell block, the control logic is further configured to perform an erase operation on a first subset of a plurality of ground selection transistors of the first cell block at every N number of E/P cycles from the first time point and then program the first subset of the plurality of ground selection transistors of the first cell block to the first threshold voltage, to perform an erase operation on a second subset of the plurality of ground selection transistors of the first cell block and then program the second subset of the plurality of ground selection transistors of the first cell block to the second threshold voltage, to perform an erase operation on a first subset of a plurality of ground selection transistors of the second cell block at every N number of E/P cycles from a second time point and then program the first subset of the plurality of ground selection transistors of the second cell block to the first threshold voltage, and to perform an erase operation on a second subset of the plurality of ground selection transistors of the second cell block and then program the second subset of the plurality of ground selection transistors of the second cell block to the second threshold voltage, and the second time point is later in time than the first time point.

11. The memory device of claim 1, wherein at least one of the plurality of cell blocks further comprises first dummy transistors connected to upper ground dummy lines of the plurality of special word lines, second dummy transistors connected to lower ground dummy lines of the plurality of special word lines, and third dummy transistors connected to internal ground dummy lines between the plurality of special word lines, and the control logic is further configured to control each of the first dummy transistors and the second dummy transistors to operate as one of a ground selection transistor, a memory cell transistor storing data, and a third dummy transistor from the first time point.

12. The memory device of claim 1, wherein at least one of the plurality of cell blocks further comprises first dummy transistors connected to upper ground dummy lines of the plurality of special word lines, second dummy transistors connected to lower ground dummy lines of the plurality of special word lines, and third dummy transistors connected to internal ground dummy lines between the plurality of special word lines, and the control logic is further configured to control each of the first dummy transistors and the second dummy transistors to operate as one of a ground selection transistor and a memory cell transistor storing data from the first time point.

13. An operating method of a memory device including a plurality of cell blocks, the operating method comprising:

performing an erase operation on a first subset of a plurality of ground selection transistors at every N (where N is an integer of 1 or more) number of erase/program (E/P) cycles from a first time point and then programming the first subset of the plurality of ground selection transistors to a first threshold voltage; and performing an erase operation on the other ground selection transistors from the first time point and then programming a second subset of the plurality of ground selection transistors to a second threshold voltage, wherein at least one of the plurality of cell blocks comprises the plurality of ground selection transistors connected to a plurality of special word lines.

14. The operating method of claim 13, wherein the first time point is a $k^{th}$ (where k is a positive integer) E/P cycle.

15. The operating method of claim 13, further comprising:

performing an erase operation on the first subset of the plurality of ground selection transistors until before the first time point and then programming the first subset of the plurality of ground selection transistors to the first threshold voltage until before the first time point, based on monitoring of threshold voltages of the plurality of ground selection transistors; and performing, based on monitoring of the threshold voltages of the plurality of ground selection transistors, an erase operation on the second subset of the plurality of ground selection transistors until before the first time point and then programming the second subset of the plurality of ground selection transistors to the second threshold voltage until before the first time point.

16. The operating method of claim 13, wherein performing the erase operation of the first and second subsets of the plurality of ground selection transistors is performed when programming of at least one of the first threshold voltage of the first subset of the plurality of ground selection transistors and the second threshold voltage of the second subset of the plurality of ground selection transistors fails.

17. The operating method of claim 13, wherein the plurality of cell blocks comprise a first cell block and a second cell block, a memory cell level of the first cell block is higher than a memory cell level of the second cell block, and the operating method further comprises:

performing an erase operation on a first subset of a plurality of ground selection transistors of the first cell block at every N number of E/P cycles from the first time point and then programming the first subset of a plurality of ground selection transistors of the first cell block to the first threshold voltage;

performing an erase operation on a second subset of the plurality of ground selection transistors of the first cell block at every N number of E/P cycles from the first time point and then programming the second subset of the plurality of ground selection transistors of the first cell block to the second threshold voltage;

performing an erase operation on a first subset of a plurality of ground selection transistors of the second cell block at every N number of E/P cycles from a second time point, which is later in time than the first time point, and then programming the first subset of the plurality of ground selection transistors of the second cell block to the first threshold voltage; and performing an erase operation on a second subset of the plurality of ground selection transistors of the second cell block at every N number of E/P cycles from the second time point and then programming the second subset of the plurality of ground selection transistors of the second cell block to the second threshold voltage.

18. The operating method of claim 13, wherein the plurality of cell blocks further comprises first dummy transistors connected to upper dummy lines on the plurality of special word lines, second dummy transistors connected to lower dummy lines under the plurality of special word lines, and third dummy transistors connected to inside dummy lines between the plurality of special word lines, and the operating method further comprises controlling each of the first dummy transistors and the second dummy transistors to operate as one of a ground selection transistor, a memory cell transistor storing data, and a third dummy transistor from the first time point.

19. The operating method of claim 13, wherein the plurality of cell blocks further comprises first dummy transistors connected to upper dummy lines on the plurality of special word lines, second dummy transistors connected to lower dummy lines under the plurality of special word lines, and third dummy transistors connected to inside dummy lines between the plurality of special word lines, and the operating method further comprises controlling each of the first dummy transistors and the second dummy transistors to operate as one of a ground selection transistor and a memory cell transistor storing data, from the first time point.

20. A memory device, comprising:

a memory cell array including a plurality of cell blocks, each of the plurality of cell blocks including a plurality of cell strings connected in parallel between a bit line and a common source line; and a control logic configured to control a program operation, a read operation, and an erase operation on the memory cell array, wherein at least one of the plurality of cell blocks comprises a special word line region including a plurality of ground selection transistors connected to a corresponding plurality of special word lines and a plurality of dummy transistors connected to a corresponding plurality of special dummy lines, a first subset of the plurality of ground selection transistors are programmed to a first threshold voltage, and a second subset of the plurality of ground selection transistors are programmed to a second threshold voltage which is higher than the first threshold voltage, the control logic is configured to perform an erase operation on the first subset of the plurality of ground selection transistors at every N (where N is an integer of 1 or more) number of erase/program (E/P) cycles from a first time point and then program the first subset of the plurality of ground selection transistors to the first threshold voltage, and perform an erase operation on the second subset of the plurality of ground selection transistors and then program the second subset of the plurality of ground selection transistors to the second threshold voltage, and the control logic is further configured to perform control so that a number of dummy transistors decreases from the first time point.

* * * * *